(12) United States Patent
Jeon et al.

(10) Patent No.: US 11,942,154 B2
(45) Date of Patent: Mar. 26, 2024

(54) NON-VOLATILE MEMORY DEVICE AND METHOD OF OPERATING NONVOLATILE MEMORY DEVICE

(71) Applicant: SAMSUNG ELECTRONICS CO., LTD., Suwon-si (KR)

(72) Inventors: Hongsoo Jeon, Suwon-si (KR); Bongsoon Lim, Seoul (KR); Sangwan Nam, Busan (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 133 days.

(21) Appl. No.: 17/825,764

(22) Filed: May 26, 2022

(65) Prior Publication Data

US 2023/0162791 A1 May 25, 2023

(30) Foreign Application Priority Data

Nov. 22, 2021 (KR) .................. 10-2021-0161184

(51) Int. Cl.
*G11C 16/04* (2006.01)
*G11C 5/06* (2006.01)
(Continued)

(52) U.S. Cl.
CPC .......... *G11C 16/0433* (2013.01); *G11C 5/063* (2013.01); *G11C 16/08* (2013.01); *G11C 16/20* (2013.01)

(58) Field of Classification Search
CPC ..... G11C 16/0433; G11C 5/063; G11C 16/08; G11C 16/20; G11C 16/0483; G11C 16/34;
(Continued)

(56) References Cited

U.S. PATENT DOCUMENTS 5,963,475 A 10/1999 Choi et al.
9,240,239 B2 1/2016 Kang et al.
(Continued)

FOREIGN PATENT DOCUMENTS

CN 106558591 A * 4/2017 ......... H01L 23/5283
CN 108431956 A * 8/2018 ......... G11C 16/0483
(Continued)

OTHER PUBLICATIONS

Extended European search report dated Oct. 25, 2022 from the European Patent Office in corresponding European Patent Application No. 22176411.1.
(Continued)

*Primary Examiner* — Michael T Tran
(74) *Attorney, Agent, or Firm* — F. Chau & Associates, LLC

(57) ABSTRACT

A nonvolatile memory device includes a first semiconductor layer and a second semiconductor layer. The first semiconductor layer includes word-lines, at least one string selection line, at least one ground selection line, and a memory cell array including at least one memory block. The second semiconductor includes a first address decoder and a second address decoder. The first address decoder is disposed under a first extension region adjacent to a first side of a cell region and includes a plurality of first pass transistors driving the word-lines, the at least one string selection line, and the at least one ground selection line. The second address decoder is disposed under a second extension region adjacent to a second side of the cell region and includes a plurality of second pass transistors driving the at least one string selection line and the at least one ground selection line.

20 Claims, 26 Drawing Sheets

(51) Int. Cl.
*G11C 16/08* (2006.01)
*G11C 16/20* (2006.01)

(58) Field of Classification Search
CPC .. G11C 8/10; G11C 8/14; G11C 16/10; H10B 41/27; H10B 41/40; H10B 43/27; H10B 43/40; H10B 43/35; H10B 43/50
USPC ........................................ 365/185.05, 230.06
See application file for complete search history.

(56) References Cited

U.S. PATENT DOCUMENTS

| | | | |
|---|---|---|---|
| 10,127,985 B2 | 11/2018 | Yamaoka | |
| 10,559,330 B2 | 2/2020 | Eom | |
| 11,004,787 B2 | 5/2021 | Ichikawa et al. | |
| 11,081,185 B2 | 8/2021 | Chibvongodze et al. | |
| 2012/0170365 A1* | 7/2012 | Kang | G11C 16/10 365/185.11 |
| 2014/0085979 A1* | 3/2014 | Kono | H10B 43/50 365/185.11 |
| 2015/0023103 A1* | 1/2015 | Aritome | G11C 16/04 365/185.12 |
| 2016/0233270 A1* | 8/2016 | Takaki | H10B 63/34 |
| 2017/0076805 A1* | 3/2017 | Goda | G11C 16/10 |
| 2018/0254087 A1* | 9/2018 | Yamaoka | G11C 16/3427 |
| 2019/0392905 A1* | 12/2019 | Hioka | G11C 16/26 |
| 2020/0194458 A1* | 6/2020 | Kim | H01L 29/42368 |
| 2020/0234747 A1* | 7/2020 | Redaelli | G11C 5/02 |
| 2021/0098062 A1* | 4/2021 | Kwon | G11C 5/025 |
| 2021/0118903 A1 | 4/2021 | Yun et al. | |
| 2021/0202496 A1* | 7/2021 | Nam | H10B 43/10 |
| 2021/0217760 A1 | 7/2021 | Yang et al. | |
| 2021/0265389 A1 | 8/2021 | Kim et al. | |
| 2022/0302099 A1* | 9/2022 | Lee | H01L 25/18 |
| 2022/0319604 A1* | 10/2022 | Chae | G11C 5/025 |

FOREIGN PATENT DOCUMENTS

| | | | | |
|---|---|---|---|---|
| CN | 112117277 A | * | 12/2020 | ......... H01L 23/5226 |
| CN | 113196481 A | * | 7/2021 | ........... G11C 11/223 |
| CN | 111724845 B | * | 11/2023 | ........... G11C 11/161 |
| TW | 201511010 A | * | 3/2015 | |

OTHER PUBLICATIONS

Office Action dated Aug. 24, 2023 from the European Patent Office in corresponding European Patent Application No. 22176411.1.

* cited by examiner

ELECTRICALLY CONNECT FIRST PASS TRANSISTORS IN THE FIRST ADDRESS DECODER TO THE PLURALITY OF WORD-LINES, THE AT LEAST ONE STRING SELECTION LINE AND THE AT LEAST ONE GROUND SELECTION LINE THROUGH THROUGH-HALL CONTACTS PENETRATING A STAIR REGION IN THE FIRST EXTENSION REGION —S115

ELECTRICALLY CONNECT SECOND PASS TRANSISTORS IN THE SECOND ADDRESS DECODER TO THE AT LEAST ONE STRING SELECTION LINE AND THE AT LEAST ONE GROUND SELECTION LINE THROUGH THROUGH-HALL VIAS PENETRATING AN INSULATING MOLD STRUCTURE IN THE SECOND EXTENSION REGION AND SELECTION LINE CONTACTS —S135

NON-VOLATILE MEMORY DEVICE AND METHOD OF OPERATING NONVOLATILE MEMORY DEVICE

CROSS-REFERENCE TO RELATED APPLICATION

This application claims priority under 35 U.S.C. § 119 to Korean Patent Application No. 10-2021-0161184, filed on Nov. 22, 2021 in the Korean Intellectual Property Office (KIPO), the disclosure of which is incorporated by reference herein in its entirety.

TECHNICAL FIELD

Example embodiments generally relate to memory devices, and more particularly, to nonvolatile memory devices and methods of operating nonvolatile memory devices.

DISCUSSION OF RELATED ART

Semiconductor memory devices for storing data may be classified into volatile memory devices and nonvolatile memory devices. Volatile memory devices, such as dynamic random access memory (DRAM) devices, are typically configured to store data by charging or discharging capacitors in memory cells, and lose the stored data when power is off. Nonvolatile memory devices, such as flash memory devices, may maintain stored data even though power is off. Volatile memory devices are widely used as main memories of various apparatuses, while nonvolatile memory devices are widely used for storing program code and/or data in various electronic devices such as, for example, computers, mobile devices, etc.

Recently, nonvolatile memory devices of a three-dimensional structure such as a vertical NAND memory device have been developed to increase integration degree and memory capacity of the nonvolatile memory devices.

SUMMARY

Some example embodiments may provide a nonvolatile memory device including address decoders that drive a cell region with different voltages at respective sides of the cell region.

Some example embodiments may provide a method of operating a nonvolatile memory device including address decoders that drive a cell region with different voltages at respective sides of the cell region.

According to some example embodiments, a nonvolatile memory device includes a first semiconductor layer and a second semiconductor layer. The first semiconductor layer includes an upper substrate in which a plurality of word-lines extending in a first horizontal direction, at least one string selection line, at least one ground selection line, and a plurality of bit-lines extending in a second horizontal direction substantially perpendicular to the first horizontal direction are disposed, and a memory cell array including at least one memory block on the upper substrate. The second semiconductor layer is disposed under the first semiconductor layer in a vertical direction substantially perpendicular to the first and second horizontal directions, and includes a first address decoder and a second address decoder. The at least one memory block includes a cell region including a plurality of memory cells, a first extension region disposed in a first side of the cell region, and a second extension region disposed in a second side of the cell region, the second side opposed to the first side. The first address decoder is disposed under the first extension region and includes a plurality of first pass transistors driving the plurality of word-lines, the at least one string selection line, and the at least one ground selection line. The second address decoder is disposed under the second extension region and includes a plurality of second pass transistors driving the at least one string selection line and the at least one ground selection line.

According to some example embodiments, a nonvolatile memory device includes a first semiconductor layer and a second semiconductor layer. The first semiconductor layer includes an upper substrate in which a plurality of word-lines extending in a first horizontal direction, at least two string selection lines, at least one ground selection line, and a plurality of bit-lines extending in a second horizontal direction substantially perpendicular to the first horizontal direction are disposed, and a memory cell array including at least one memory block disposed on the upper substrate. The second semiconductor layer is disposed under the first semiconductor layer in a vertical direction substantially perpendicular to the first and second horizontal directions, and includes a first address decoder and a second address decoder. The at least one memory block includes a cell region including a plurality of memory cells, a first extension region disposed in a first side of the cell region, and a second extension region disposed in a second side of the cell region, the second side opposed to the first side. The first address decoder is disposed under the first extension region and includes a plurality of first pass transistors configured to drive the plurality of word-lines, the at least two string selection lines, and the at least one ground selection line. The second address decoder is disposed under the second extension region and includes a plurality of second pass transistors configured to drive the at least two string selection lines. The first extension region includes a plurality of step zones and a second extension region includes an insulating mold structure. A plurality of through-hall contacts are disposed and penetrate the plurality of step zones, and the plurality of first pass transistors are electrically connected to the plurality of word-lines, the at least two string selection lines, and the at least one ground selection line. A plurality of through-hall vias are disposed and penetrate the insulating mold structure, and the plurality of second pass transistors are electrically connected to the at least two string selection lines.

According to some example embodiments, in a method of operating a nonvolatile memory device, a plurality of word-lines, at least one string selection line, and at least one ground selection line, which are disposed in a first semiconductor layer, are driven by a first address decoder disposed in a second semiconductor layer and disposed under a first extension region of a first side of a cell region including a plurality of memory cells in the first semiconductor layer, and the at least one string selection line and the at least one ground selection line are driven by a second address decoder disposed in the second semiconductor layer and disposed under a second extension region of a second side opposed to the first side, of the cell region.

Therefore, in the nonvolatile memory device according to example embodiments, the first pass transistors in the first address decoder in the second semiconductor layer drive the string selection line, the word-lines, and the ground selection line, and the second pass transistors in the second address decoder in the second semiconductor layer drive the string selection line and the ground selection line GSL. In addition, each gate of the first pass transistors may be connected to the block word-line by upper conductive lines in the first semiconductor layer and lower conductive lines in the second semiconductor layer, and each gate of the second pass transistors may be connected to the block word-line by the lower conductive lines in the second semiconductor layer. Therefore, the nonvolatile memory device may prevent and/or reduce performance degradation due to increase of resistance of the string selection and may simplify wiring.

BRIEF DESCRIPTION OF THE DRAWINGS

The above and other features of the present disclosure will become more apparent by describing in detail example embodiments thereof with reference to the accompanying drawings.

FIG. 24 illustrates an example operation of driving by the first address decoder in FIG. 23.

FIG. 25 illustrates an example operation of driving by the second address decoder in FIG. 23.

DETAILED DESCRIPTION OF THE EMBODIMENTS

Figure 1:
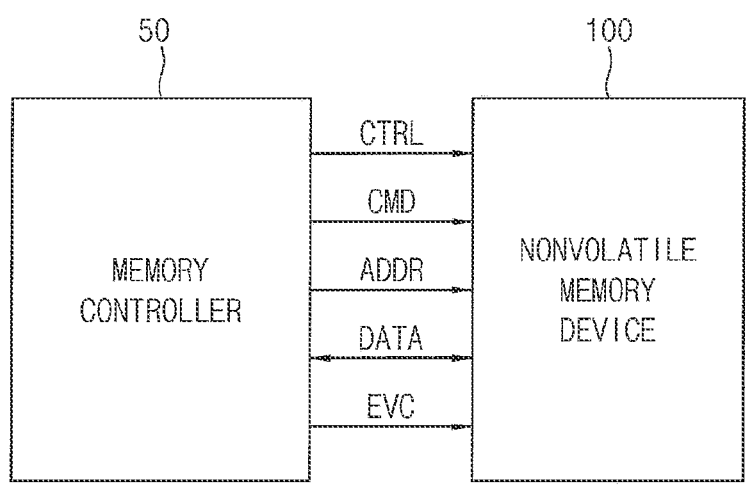
FIG. 1 is a block diagram illustrating a memory system (e.g., a storage device) according to example embodiments.

Example embodiments of the present disclosure will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an example embodiment may be described as a "second" element in another example embodiment.

It should be understood that descriptions of features or aspects within each example embodiment should typically be considered as available for other similar features or aspects in other example embodiments, unless the context clearly indicates otherwise.

As used herein, the singular forms "a", "an" and "the" are intended to include the plural forms as well, unless the context clearly indicates otherwise.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below.

It will be understood that when a component such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words used to describe the relationships between components should be interpreted in a like fashion.

It will be further understood that when two components or directions are described as extending substantially parallel or perpendicular to each other, the two components or directions extend exactly parallel or perpendicular to each other, or extend approximately parallel or perpendicular to each other within a measurement error as would be understood by a person having ordinary skill in the art.

FIG. 1 is a block diagram illustrating a memory system (e.g., a storage device) according to example embodiments.

Referring to FIG. 1, a storage device (e.g., a memory system) 10 may include a memory controller 50 and at least one nonvolatile memory device 100.

In example embodiments, each of the memory controller 50 and the nonvolatile memory device 100 may be provided in the form of, for example, a chip, a package, or a module. Alternatively, the memory controller 50 and the nonvolatile memory device 100 may be packaged into one of various packages.

The nonvolatile memory device 100 may perform, for example, an erase operation, a program operation or a write operation under control of the memory controller 50. The nonvolatile memory device 100 receives a command CMD, an address ADDR and data DATA through input/output lines from the memory controller 50 for performing such operations. In addition, the nonvolatile memory device 100 receives a control signal CTRL through a control line from the memory controller 50. In addition, the nonvolatile memory device 100 receives an external voltage EVC through a power line from the memory controller 50.

Figure 2:
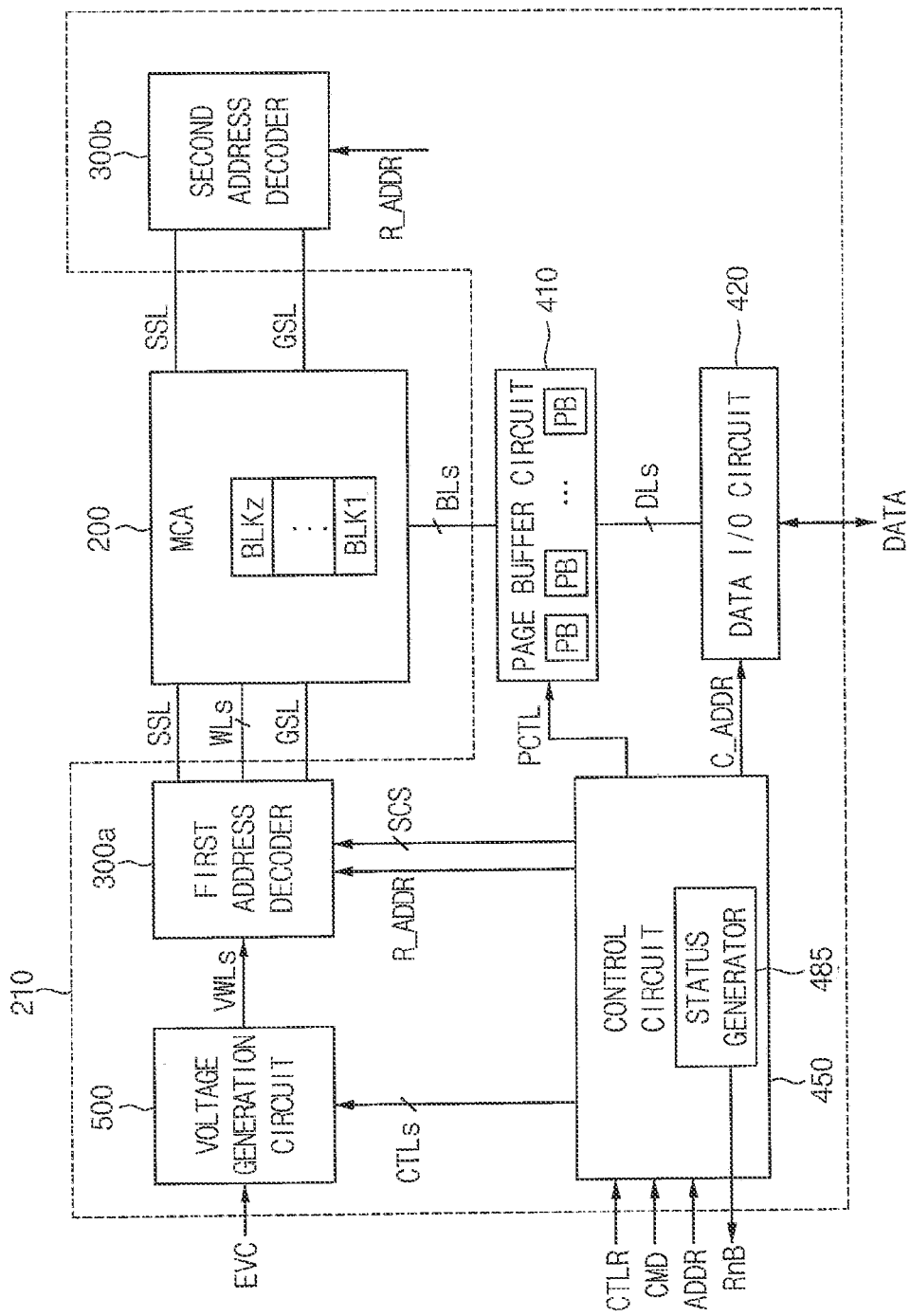
FIG. 2 is a block diagram illustrating the nonvolatile memory device in the memory system of FIG. 1 according to example embodiments.

FIG. 2 is a block diagram illustrating the nonvolatile memory device in the memory system of FIG. 1 according to example embodiments.

Referring to FIG. 2, the nonvolatile memory device 100 may include a memory cell array 200 and a peripheral circuit 210. The peripheral circuit 210 may include a page buffer circuit 410, a data input/output (I/O) circuit 420, a control circuit 450, a voltage generation circuit 500, a first address decoder 300a and a second address decoder 300b. In example embodiments, the peripheral circuit 210 may further include, for example, an input/output (I/O) interface, a column logic, a pre-decoder, a temperature sensor, a command decoder, etc.

The memory cell array 200 may be coupled to the first address decoder 300a through a string selection line SSL, a plurality of word-lines WLs, and a ground selection line GSL. The memory cell array 200 may be coupled to the second address decoder 300b through the string selection line SSL and the ground selection line GSL.

In addition, the memory cell array 200 may be coupled to the page buffer circuit 410 through a plurality of bit-lines BLs. The memory cell array 200 may include a plurality of nonvolatile memory cells coupled to the plurality of word-lines WLs and the plurality of bit-lines BLs.

The memory cell array 200 may include a plurality of memory blocks BLK1 through BLKz, and each of the memory blocks BLK1 through BLKz may have a three-dimensional (3D) structure. Here, z is an integer greater than two. The memory cell array 200 may include a plurality of vertical cell strings (e.g., NAND strings) and each of the vertical cell strings includes a plurality of memory cells stacked with respect to each other.

The control circuit 450 may receive a command CMD, an address ADDR, and a control signal CTRL from the memory controller 50 and may control, for example, an erase loop, a program loop and a read operation of the nonvolatile memory device 100. The program loop may include a program operation and a program verification operation and the erase loop may include an erase operation and an erase verification operation.

In example embodiments, the control circuit 450 may generate control signals CTLs, which are used for controlling the voltage generation circuit 500, based on the command CMD, may generate a page buffer control signal PCTL for controlling the page buffer circuit 410, may generate switching control signals SCS for controlling the address decoder 300, and may generate a row address R_ADDR and a column address C_ADDR based on the address ADDR. The control circuit 450 may provide the control signals CTLs to the voltage generation circuit 500 and may provide the page buffer control signal PCTL to the page buffer circuit 410.

In addition, the control circuit 450 may provide the row address R_ADDR and the switching control signals SCS to the first address decoder 300a, may provide the row address R_ADDR to the second address decoder 300b and may provide the column address C_ADDR to the data I/O circuit 420. The control circuit 450 may include a status signal generator 485 which may generate a status signal RnB indicating an operating status of the nonvolatile memory device 100. The status signal RnB may be referred to as a ready/busy signal because the status signal RnB indicates either a busy state or a ready state of the nonvolatile memory device 100.

The first address decoder 300a may be coupled to the memory cell array 200 through the string selection line SSL, the plurality of word-lines WLs, and the ground selection line GSL, and the second address decoder 300b may be coupled to the memory cell array 200 through the string selection line SSL and the ground selection line GSL. During program operation or read operation, the first address decoder 300a may determine one of the plurality of word-lines WLs as a selected word-line based on the row address R_ADDR and may determine the rest of the plurality of word-lines WLs except the selected word-line as unselected word-lines.

The voltage generation circuit 500 may generate word-line voltages VWLs, a turn-on voltage and a turn-off voltage associated with operations of the nonvolatile memory device 100 using the external voltage EVC provided from the memory controller 50 based on control signals CTLs from the control circuit 450. The word-line voltages VWLs may include, for example, a program voltage, a read voltage, a pass voltage, an erase verification voltage, or a program verification voltage. The word-line voltages VWLs may be applied to the plurality of word-lines WLs through the first address decoder 300a, and the turn-on voltage and the turn-off voltage may be applied to the string selection line SSL and the ground selection line GSL through the first address decoder 300a and the second address decoder 300b.

For example, during the erase operation, the voltage generation circuit 500 may apply an erase voltage to a well of a selected memory block and may apply a ground voltage to all word-lines of the selected memory block. During the erase verification operation, the voltage generation circuit 500 may apply an erase verification voltage to all word-lines of the selected memory block or may apply the erase verification voltage to the word-lines of the selected memory block on a word-line basis.

For example, during the program operation, the voltage generation circuit 500 may apply a program voltage to the selected word-line and may apply a program pass voltage to the unselected word-lines. In addition, during the program verification operation, the voltage generation circuit 500 may apply a program verification voltage to the selected word-line and may apply a verification pass voltage to the unselected word-lines. In addition, during the read operation, the voltage generation circuit 500 may apply a read voltage to the selected word-line and may apply a read pass voltage to the unselected word-lines.

The page buffer circuit 410 may be coupled to the memory cell array 200 through the plurality of bit-lines BLs. The page buffer circuit 410 may include a plurality of page buffers PB. The page buffer circuit 410 may temporarily store data to be programmed in a selected page or data read out from the selected page of the memory cell array 200.

Figure 7:
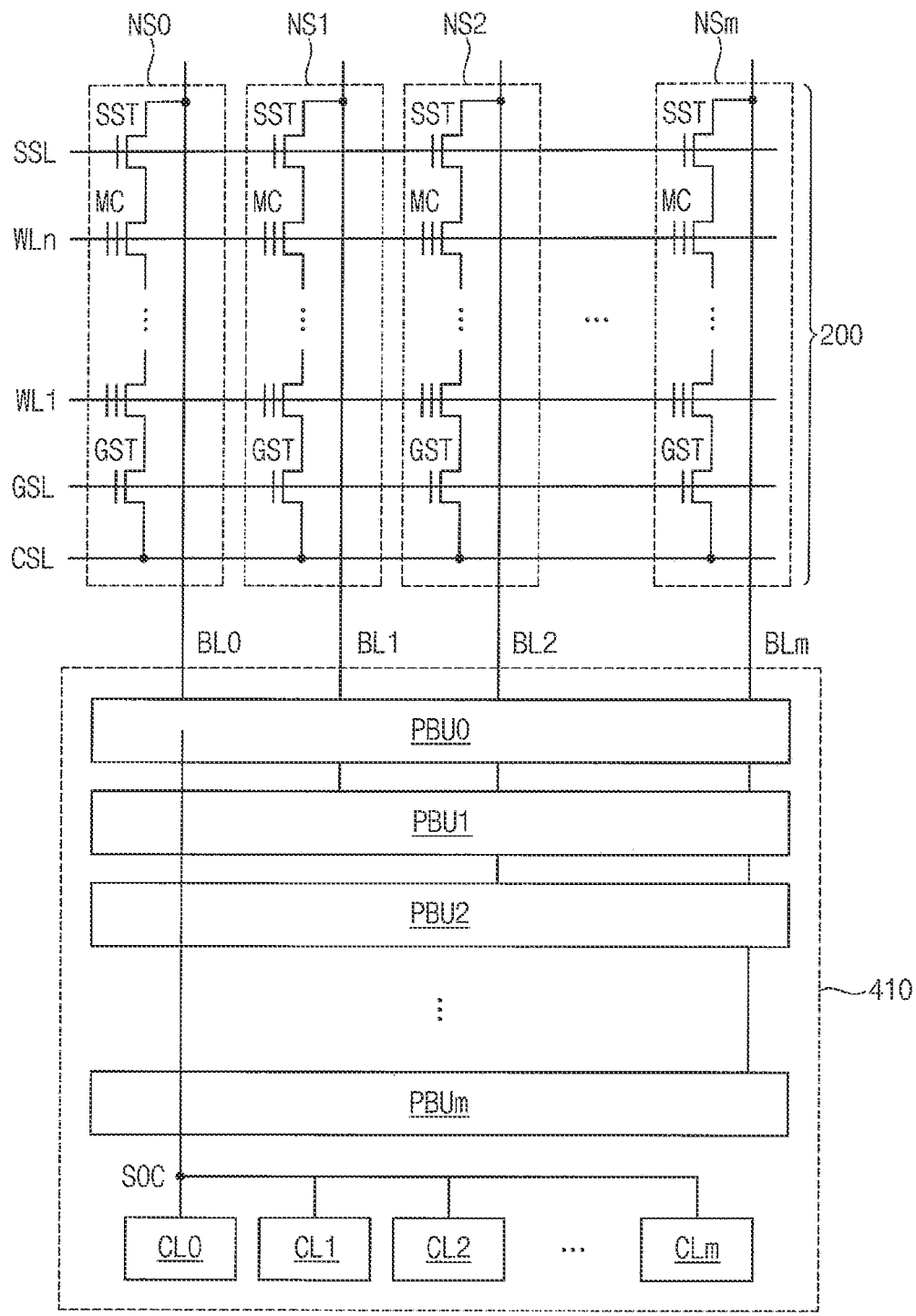
FIG. 7 is a schematic diagram of a connection of the memory cell array to the page buffer circuit in FIG. 2, according to example embodiments.

In example embodiments, page buffer units included in each of the plurality of page buffers PB (for example, first through (m+1)th page buffer units PBU0 through PBUm in FIG. 7) and cache latches included in each of the plurality of page buffers PB (for example, first through (m+1)th cache latches CL0 through CLm in FIG. 7) may be spaced apart from each other, and may have separate structures. Accordingly, the degree of freedom of wirings on the page buffer units may be increased, and the complexity of a layout may be reduced. In addition, because the cache latches are adjacent to data I/O lines, the distance between the cache latches and the data I/O lines may be reduced, and thus, data I/O speed may be increased.

The data I/O circuit 420 may be coupled to the page buffer circuit 410 through a plurality of data lines DLs. During the program operation, the data I/O circuit 420 may receive program data DATA from the memory controller 50 and provide the program data DATA to the page buffer circuit 410 based on the column address C_ADDR received from the control circuit 450. During the read operation, the data I/O circuit 420 may provide read data DATA to the memory controller 50 based on the column address C_ADDR received from the control circuit 450.

Figure 3:
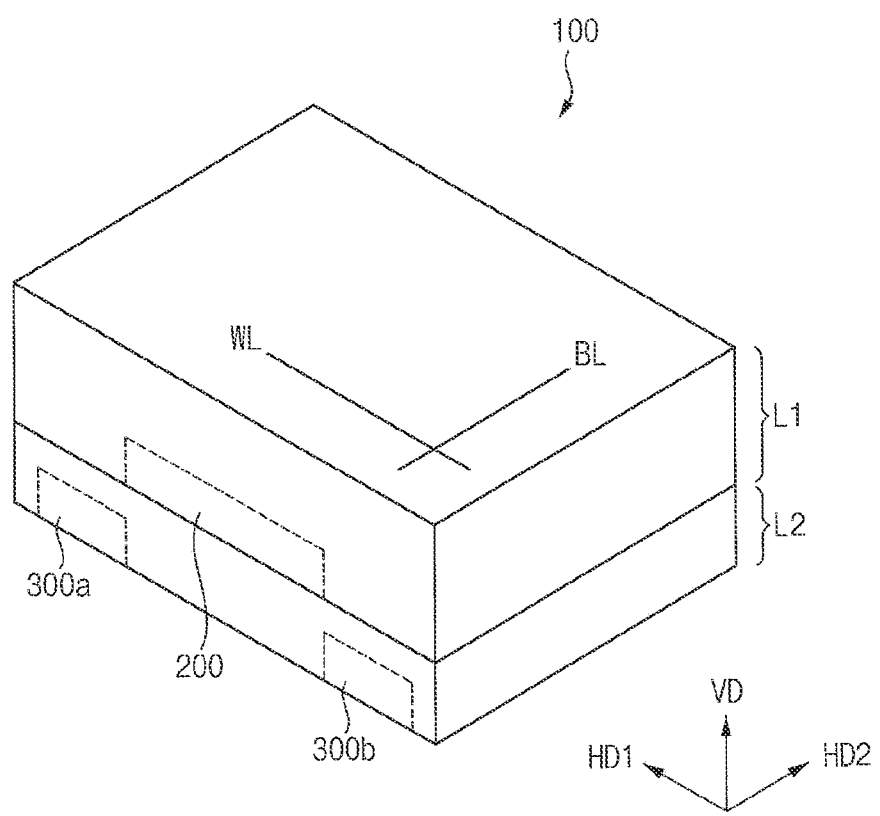
FIG. 3 schematically illustrates a structure of the nonvolatile memory device of FIG. 2 according to example embodiments.

FIG. 3 schematically illustrates a structure of the nonvolatile memory device of FIG. 2 according to example embodiments.

Referring to FIG. 3, the nonvolatile memory device 100 may include a first semiconductor layer L1 and a second semiconductor layer L2. The first semiconductor layer L1 may be stacked in a vertical direction VD with respect to the second semiconductor layer L2. The second semiconductor layer L2 may be disposed under the first semiconductor layer L1 in the vertical direction VD, and accordingly, the second semiconductor layer L2 may be close to a substrate. For example, among the first semiconductor layer L1 and the second semiconductor layer L2, the second semiconductor layer L2 may be disposed closer to a substrate.

In example embodiments, the memory cell array 200 in FIG. 2 may be formed (or provided) on the first semiconductor layer L1, and the peripheral circuit 210 in FIG. 2 may be formed (or provided) on the second semiconductor layer L2. In addition, the first address decoder 300a may be disposed under a first side of the memory cell array 200 in the second semiconductor layer L2 and the second address decoder 300b may be disposed under a second side of the memory cell array 200 in the second semiconductor layer L2. The second side may be opposed to the first side.

Accordingly, the nonvolatile memory device 100 may have a structure in which the memory cell array 200 is disposed on the peripheral circuit 210, that is, a cell over periphery (COP) structure. The COP structure may effectively reduce an area in a horizontal direction and increase the degree of integration of the nonvolatile memory device 100.

In example embodiments, the second semiconductor layer L2 may include a substrate, and by forming transistors on the substrate and metal patterns for wiring transistors, the peripheral circuit 210 may be formed in the second semiconductor layer L2. After the peripheral circuit 210 is formed on the second semiconductor layer L2, the first semiconductor layer L1 including the memory cell array 200 may be formed, and the metal patterns for connecting the word-lines WL and the bit-lines BL of the memory cell array 200 to the peripheral circuit 210 formed in the second semiconductor layer L2 may be formed. For example, the bit-lines BL may extend in a second horizontal direction HD2, and the word-lines WL may extend in a first horizontal direction HD1.

As the number of stages of memory cells in the memory cell array 200 increases with the development of semiconductor processes, that is, as the number of stacked word-lines WL increases, an area of the memory cell array 200 may decrease, and accordingly, an area of the peripheral circuit 210 may also be reduced. According to an embodiment, to reduce an area of a region occupied by the page buffer circuit 410, the page buffer circuit 410 may have a structure in which the page buffer unit and the cache latch are separated from each other, and may connect sensing nodes included in each of the page buffer units commonly to a combined sensing node. This will be described in further detail below with reference to FIG. 8.

Figure 4:
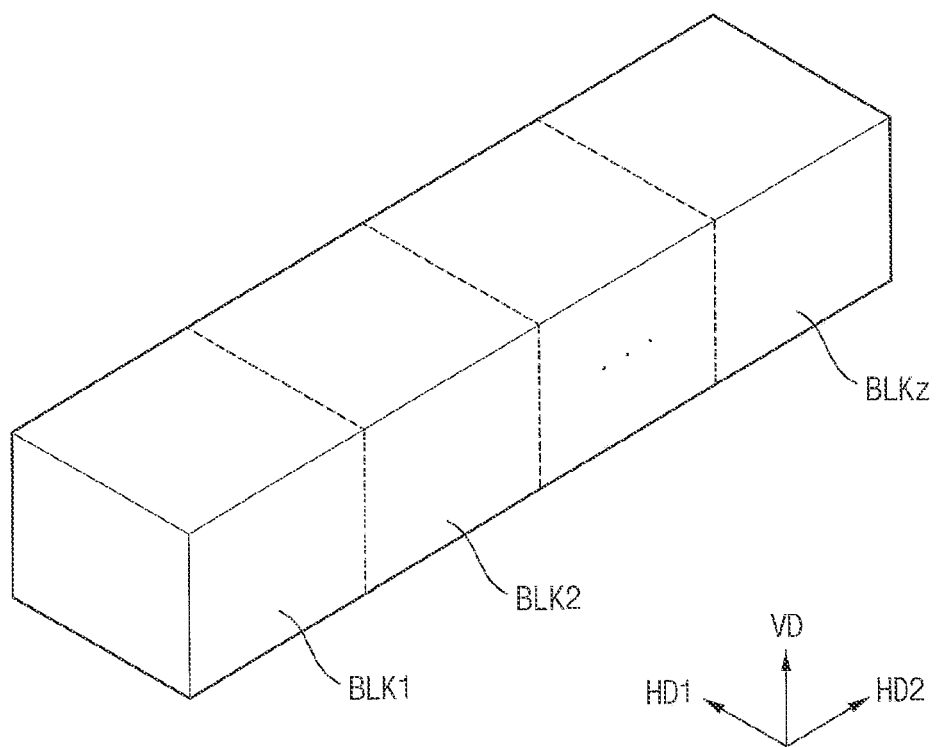
FIG. 4 is a block diagram illustrating an example of the memory cell array in FIG. 2 according to example embodiments.

FIG. 4 is a block diagram illustrating an example of the memory cell array in FIG. 2 according to example embodiments.

Referring to FIG. 4 the memory cell array 200 may include a plurality of memory blocks BLK1 to BLKz which extend along a plurality of directions HD1, HD2 and VD, in which z is a positive integer. In an embodiment, the memory blocks BLK1 to BLKz are selected by the first address decoder 300a in FIG. 2. For example, the first address decoder 300a may select a memory block BLK corresponding to a block address among the memory blocks BLK1 to BLKz.

Figure 5:
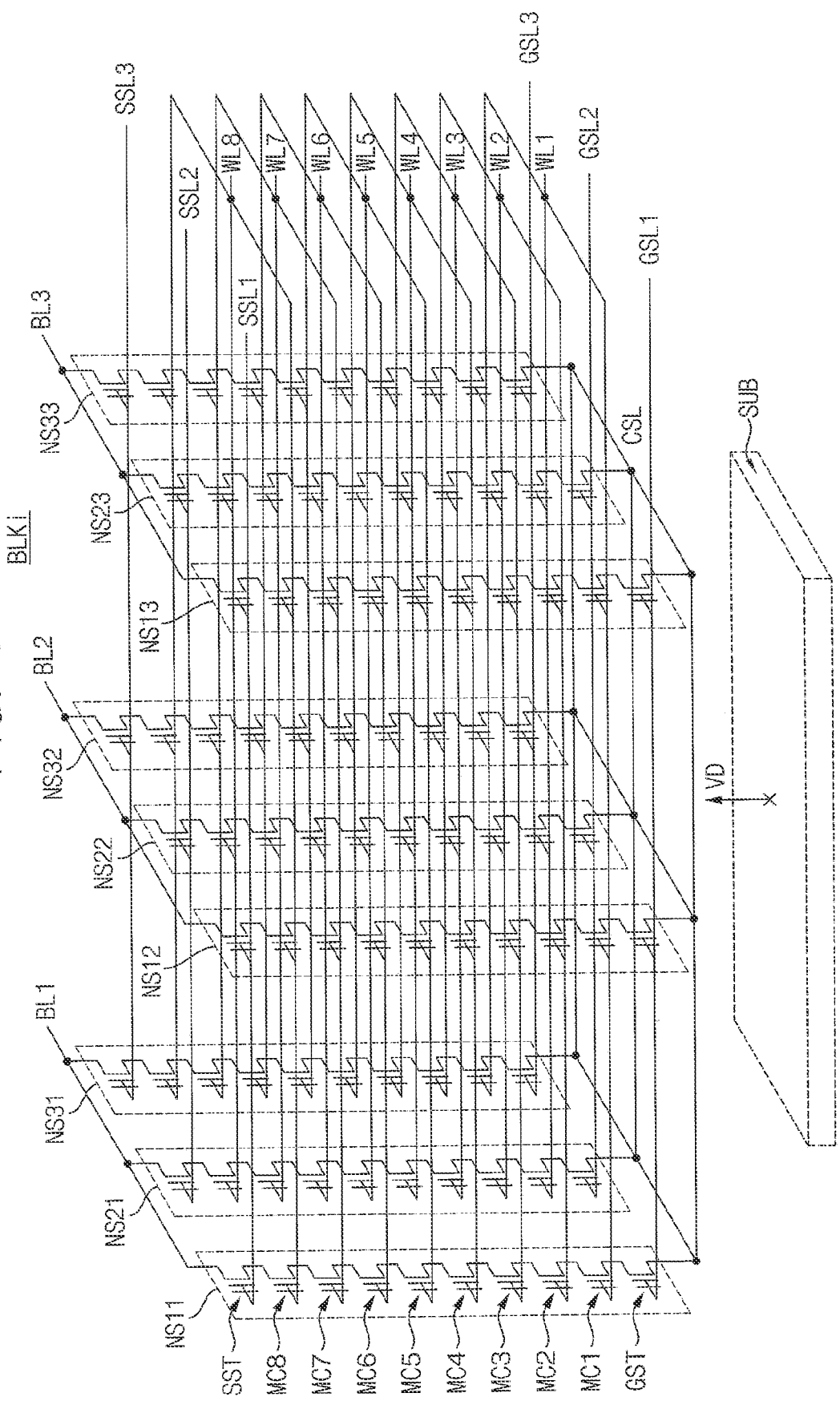
FIG. 5 is a circuit diagram illustrating one of the memory blocks of FIG. 4 according to example embodiments.

FIG. 5 is a circuit diagram illustrating one of the memory blocks of FIG. 4 according to example embodiments.

The memory block BLKi of FIG. 5 may be formed on a substrate SUB in a three-dimensional structure (or a vertical structure). For example, a plurality of memory cell strings included in the memory block BLKi may be formed in the vertical direction VD substantially perpendicular to the substrate SUB.

Referring to FIG. 5, the memory block BLKi may include (memory) cell strings NS11 to NS33 coupled between bit-lines BL1, BL2 and BL3 and a common source line CSL. Each of the memory cell strings NS11 to NS33 may include a string selection transistor SST, a plurality of memory cells MC1 to MC8, and a ground selection transistor GST. In FIG. 5, each of the memory cell strings NS11 to NS33 is illustrated to include eight memory cells MC1 to MC8. However, embodiments of the present disclosure are not limited thereto. For example, in some example embodiments, each of the memory cell strings NS11 to NS33 may include any number of memory cells.

The string selection transistor SST may be connected to corresponding string selection lines SSL1 to SSL3. The plurality of memory cells MC1 to MC8 may be connected to corresponding word-lines WL1 to WL8, respectively. The ground selection transistor GST may be connected to corresponding ground selection lines GSL1 to GSL3. The string selection transistor SST may be connected to corresponding bit-lines BL1, BL2 and BL3, and the ground selection transistor GST may be connected to the common source line CSL. Word-lines (e.g., WL1) having the same height may be commonly connected, and the ground selection lines GSL1 to GSL3 and the string selection lines SSL1 to SSL3 may be separated.

Figure 6:
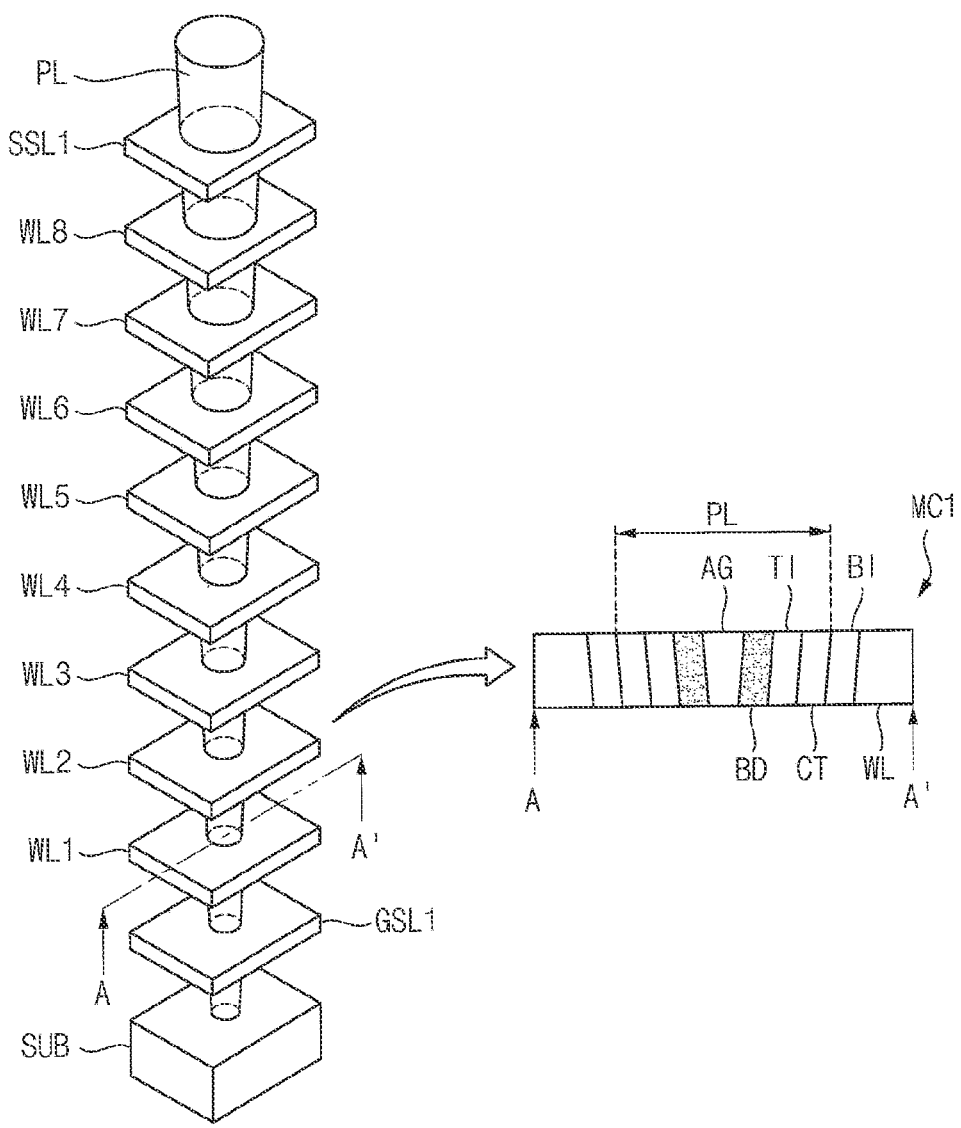
FIG. 6 illustrates an example of a structure of a cell string CS in the memory block of FIG. 5.

FIG. 6 illustrates an example of a structure of a cell string CS in the memory block of FIG. 5 according to example embodiments.

Referring to FIGS. 5 and 6, a pillar PL is provided on the substrate SUB such that the pillar PL extends in a direction substantially perpendicular to the substrate SUB to make contact with the substrate SUB. Each of the ground selection line GSL, the word-lines WL1 to WL8, and the string selection lines SSL illustrated in FIG. 6 may be formed of a conductive material substantially parallel with the substrate SUB, for example, a metallic material. The pillar PL may be in contact with the substrate SUB through the conductive materials forming the string selection lines SSL, the word-lines WL1 to WL8, and the ground selection line GSL.

A cross-sectional view taken along a line A-A' is also illustrated in FIG. 6. In some example embodiments, a cross-sectional view of a first memory cell MC1 corresponding to a first word-line WL1 is illustrated. The pillar PL may include a cylindrical body BD. An air gap AG may be defined in the interior of the body BD.

The body BD may include P-type silicon and may be an area where a channel will be formed. The pillar PL may further include a cylindrical tunnel insulating layer TI surrounding the body BD and a cylindrical charge trap layer CT surrounding the tunnel insulating layer TI. A blocking insulating layer BI may be provided between the first word-line WL1 and the pillar PL. The body BD, the tunnel insulating layer TI, the charge trap layer CT, the blocking insulating layer BI, and the first word-line WL1 may constitute or be included in a charge trap type transistor that is formed in a direction substantially perpendicular to the substrate SUB or to an upper surface of the substrate SUB. A string selection transistor SST, a ground selection transistor GST, and other memory cells may have the same structure as the first memory cell MC1.

FIG. 7 is a schematic diagram of a connection of the memory cell array to the page buffer circuit in FIG. 2, according to example embodiments.

Referring to FIG. 7, the memory cell array 200 may include first through (m+1)th NAND strings NS0 through NSm. Each of the first through (m+1)th NAND strings NS0 through NSm may include a ground select transistor GST connected to the ground select line GSL, a plurality of memory cells MC respectively connected to the first through nth word-lines WL1 through WLn, and a string select transistor SST connected to the string select line SSL. The ground select transistor GST, the plurality of memory cells MC, and the string select transistor SST may be connected to each other in series. In this case, m may be a positive integer.

The page buffer circuit 410 may include first through (m+1)th page buffer units PBU0 through PBUn. The first page buffer unit PB0 may be connected to the first NAND string NS0 via the first bit-line BL0, and the (m+1)th page buffer unit PBUn may be connected to the (m+1)th NAND string NSm via the (m+1)th bit-line BLm. In this case, n may be a positive integer. For example, m may be 7, and the page buffer circuit 410 may have a structure in which page buffer units of eight stages, or, the first through (m+1)th page buffer units PBU0 through PBUm, are in a line. For example, the first through (m+1)th page buffer units PBU0 through PBUm may be in a row in an extension direction of the first through (m+1)th bit-lines BL0 through BLm.

The page buffer circuit 410 may further include first through (m+1)th cache latches CL0 through CLm respectively corresponding to the first through (m+1)th page buffer units PBU0 through PBUn. For example, the page buffer circuit 410 may have a structure in which the cache latches of eight stages or the first through (m+1)th cache latches CL0 through CLm in a line. For example, the first through (m+1)th cache latches CL0 through CLm may be in a row in an extension direction of the first through (m+1)th bit-lines BL0 through BLm.

The sensing nodes of each of the first through (m+1)th page buffer units PBU0 through PBUm may be commonly connected to a combined sensing node SOC. In addition, the first through (m+1)th cache latches CL0 through CLm may be commonly connected to the combined sensing node SOC. Accordingly, the first through (m+1)th page buffer units PBU0 through PBUm may be connected to the first through (m+1)th cache latches CL0 through CLm via the combined sensing node SOC.

Figure 8:
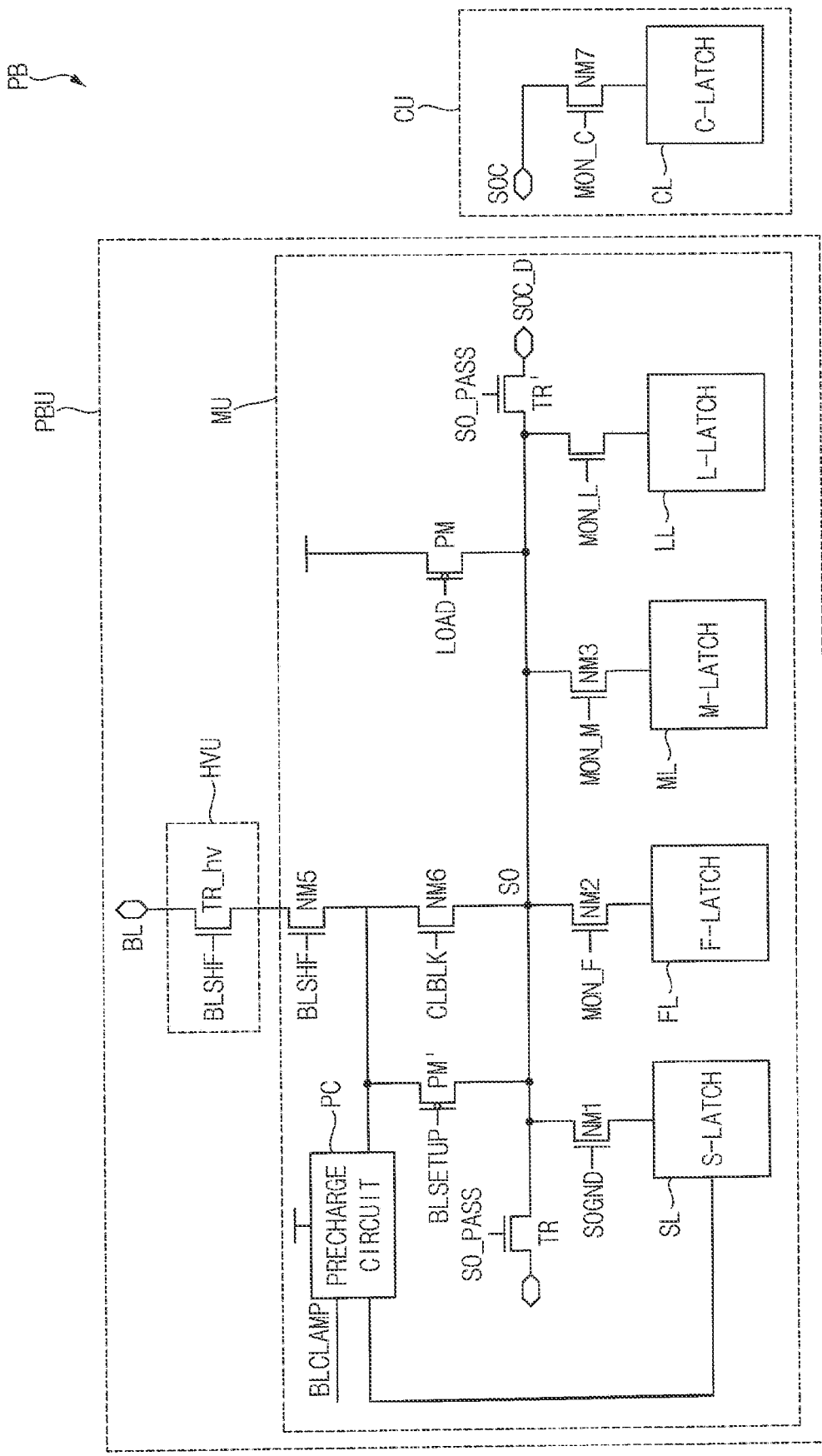
FIG. 8 illustrates in detail a page buffer according to example embodiments.

FIG. 8 illustrates in detail a page buffer according to example embodiments.

Referring to FIG. 8, the page buffer PB may correspond to an example of the page buffer PB in FIG. 2. The page buffer PB may include a page buffer unit PBU and a cache unit CU. Because the cache unit CU includes a cache latch (C-LATCH) CL, and the C-LATCH CL is connected to a data input/output line, the cache unit CU may be adjacent to the data input/output line. Accordingly, the page buffer unit PBU and the cache unit CU may be spaced apart from each other, and the page buffer PB may have a structure in which the page buffer unit PBU and the cache unit CU are spaced apart from each other.

The page buffer unit PBU may include a main unit MU. The main unit MU may include main transistors in the page buffer PB. The page buffer unit PBU may further include a bit-line selection transistor TR_hv that is connected to the bit-line BL and driven by a bit-line selection signal BLSLT. The bit-line select transistor TR_hv may include a high voltage transistor. Accordingly, the bit-line selection transistor TR_hv may be disposed in a different well region from the main unit MU, that is, in a high voltage unit HVU.

The main unit MU may include a sensing latch (S-LATCH) SL, a force latch (F-LATCH) FL, an upper bit latch (M-LATCH) ML and a lower bit latch (L-LATCH) LL. According to an embodiment, the S-LATCH SL, the F-LATCH FL, the M-LATCH ML, or the L-LATCH LL may be referred to as main latches. The main unit MU may further include a precharge circuit PC capable of controlling a precharge operation on the bit-line BL or a sensing node SO based on a bit-line clamping control signal BLCLAMP, and may further include a transistor PM' driven by a bit-line setup signal BLSETUP.

The S-LATCH SL may, during a read or program verification operation, store data stored in a memory cell MC or a sensing result of a threshold voltage of the memory cell MC. In addition, the S-LATCH SL may, during a program operation, be used to apply a program bit-line voltage or a program inhibit voltage to the bit-line BL. The F-LATCH FL may be used to increase threshold voltage distribution during the program operation. The F-LATCH FL may store force data. After the force data is initially set to '1', the force data may be converted to '0' when the threshold voltage of the memory cell MC enters a forcing region that has a lower voltage than a target region. By utilizing the force data during a program execution operation, the bit-line voltage may be controlled, and the program threshold voltage distribution may be formed narrower.

The M-LATCH ML, the L-LATCH LL, and the C-LATCH CL may be utilized to store data externally input during the program operation, and may be referred to as data latches. When data of 3 bits is programmed in one memory cell MC, the data of 3 bits may be stored in the M-LATCH ML, the L-LATCH LL, and the C-LATCH CL, respectively. Until a program of the memory cell MC is completed, the M-LATCH ML, the L-LATCH LL, and the C-LATCH CL may maintain the stored data. In addition, the C-LATCH CL may receive data read from a memory cell MC during the read operation from the S-LATCH SL, and output the received data to the outside of the page buffer PB via the data input/output line.

In addition, the main unit MU may further include first through fourth transistors NM1 through NM4. The first transistor NM1 may be connected between the sensing node SO and the S-LATCH SL, and may be driven by a ground control signal SOGND. The second transistor NM2 may be connected between the sensing node SO and the F-LATCH FL, and may be driven by a forcing monitoring signal MON_F. The third transistor NM3 may be connected between the sensing node SO and the M-LATCH ML, and may be driven by a higher bit monitoring signal MON_M. The fourth transistor NM4 may be connected between the sensing node SO and the L-LATCH LL, and may be driven by a lower bit monitoring signal MON_L.

In addition, the main unit MU may further include fifth and sixth transistors NM5 and NM6 connected to each other in series between the bit-line selection transistor TV by and the sensing node SO. The fifth transistor NM5 may be driven by a bit-line shut-off signal BLSHF, and the sixth transistor NM6 may be driven by a bit-line connection control signal CLBLK. In addition, the main unit MU may further include a precharge transistor PM. The precharge transistor PM may be connected to the sensing node SO, driven by a load signal LOAD, and precharge the sensing node SO to a precharge level in a precharge period.

In an embodiment, the main unit MU may further include a pair of pass transistors connected to the sensing node SO, or first and second pass transistors TR and TR'. According to an embodiment, the first and second pass transistors TR and TR may also be referred to as first and second sensing node connection transistors, respectively. The first and second pass transistors TR and TR' may be driven in response to a pass control signal SO_PASS. According to an embodiment, the pass control signal SO_PASS may be referred to as a sensing node connection control signal. The first pass transistor TR may be connected between a first terminal SOC_U and the sensing node SO, and the second pass transistor TR' may be between the sensing node SO and a second terminal SOC_D.

For example, when the page buffer unit PBU corresponds to the second page buffer unit PBU1 in FIG. 7, the first terminal SOC_U may be connected to one end of the pass transistor included in the first page buffer unit PBU0, and the second terminal SOC_D may be connected to one end of the pass transistor included in the third page buffer unit PBU2. In this manner, the sensing node SO may be electrically connected to the combined sensing node SOC via pass transistors included in each of the third through (n+1)th page buffer units PBU2 through PBUn.

During the program operation, the page buffer PB may verify whether the program is completed in a memory cell MC selected among the memory cells MC included in the NAND string connected to the bit-line BL. The page buffer PB may store data sensed via the bit-line BL during the program verify operation in the S-LATCH SL. The M-LATCH ML and the L-LATCH LL may be set in which target data is stored according to the sensed data stored in the S-LATCH SL.

For example, when the sensed data indicates that the program is completed, the M-LATCH ML and the L-LATCH LL may be switched to a program inhibit setup for the selected memory cell MC in a subsequent program loop. The C-LATCH CL may temporarily store input data provided from outside of the page buffer PB. During the program operation, the target data to be stored in the C-LATCH CL may be stored in the M-LATCH ML and the L-LATCH LL.

Hereinafter, it is assumed that signals for controlling elements in the page buffer circuit 410 are included in the page buffer control signal PCTL in FIG. 2.

Figure 9:
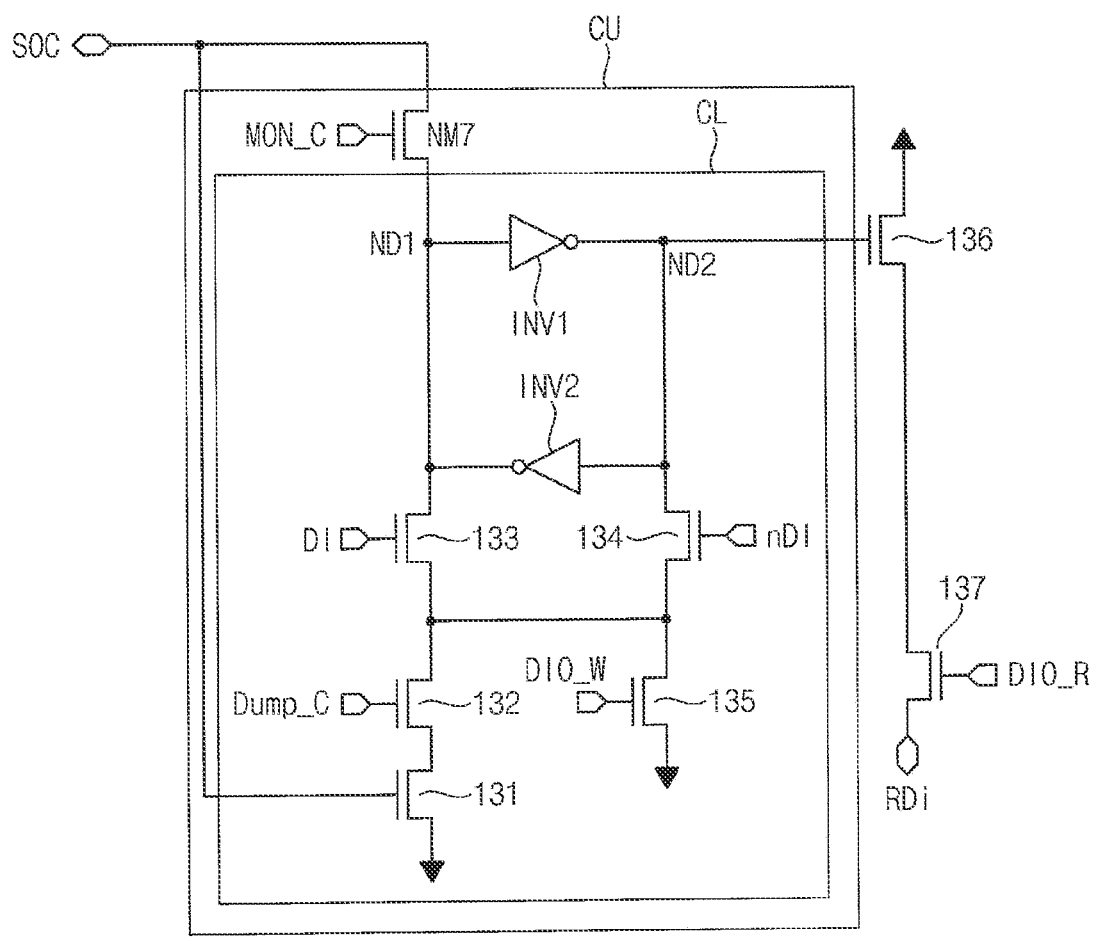
FIG. 9 is a circuit diagram illustrating an example of a cache unit according to example embodiments.

FIG. 9 is a circuit diagram illustrating an example of a cache unit according to example embodiments.

Referring to FIGS. 8 and 9, the cache unit CU may include the monitor transistor NM7 and the C-LATCH CL. The C-LATCH CL may include first and second inverters INV1 and INV2, a dump transistor 132, and transistors 131, 133 to 135. The monitor transistor NM7 may be driven based on the cache monitoring signal MON_C, and may control a connection between the coupling sensing node SOC and the C-LATCH CL.

The first inverter INV1 may be connected between the first node ND1 and the second node ND2, the second inverter INV2 may be connected between the second node ND2 and the first node ND1. Thus, the first and second inverters INV1 and INV2 may form a latch. The transistor 131 may include a gate connected to the combined sensing node SOC.

The dump transistor 132 may be driven by a dump signal Dump_C, and may transmit data stored in the C-LATCH CL to a main latch, for example, the S-LATCH SL in the page buffer unit PBU. The transistor 133 may be driven by a data signal DI, a transistor 134 may be driven by a data inversion signal nDI, and the transistor 135 may be driven by a write control signal DIO_W. When the write control signal DIO_W is activated, voltage levels of the first and second nodes ND1 and ND2 may be determined based on the data signal DI and the data inversion signal nDI, respectively.

The cache unit CU may be connected to data I/O line (or data I/O terminal) RDi via transistors 136 and 137. The transistor 136 may include a gate connected to the second node ND2, and may be turned on or off based on a voltage level of the second node ND2. The transistor 137 may be driven by a read control signal DIO_R. When the read control signal DIO_R is activated and the transistor 137 is turned on, a voltage level of the input/output terminal RDi may be determined as '1' or '0' based on a state of the C-LATCH CL.

Figure 10:
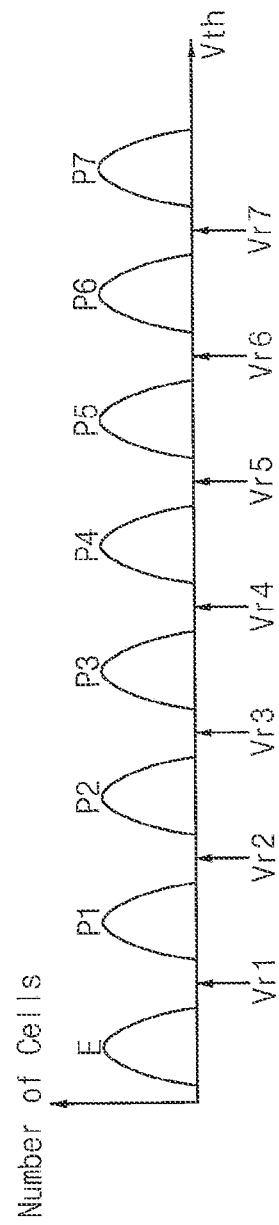
FIG. 10 is a graph showing a threshold voltage distribution of memory cells when a memory cell included in the memory cell array in FIG. 2 is a 3-bit triple level cell.

FIG. 10 is a graph showing a threshold voltage distribution of memory cells when a memory cell included in the memory cell array in FIG. 2 is a 3-bit triple level cell (TLC).

Referring to FIG. 10, the horizontal axis represents a threshold voltage Vth and the vertical axis represents the number of memory cells. When each of the memory cells is a 3-bit triple level cell programmed to store 3 bits, the memory cell may have one state from among an erase state E and first through seventh program states P1 through P7. When a memory cell is a multi-level cell, unlike a single-level cell, since an interval between threshold voltages distributions is small, a small change in the threshold voltage Vth may cause issues.

A first read voltage Vr1 has a voltage level between a distribution of a memory cell having the erase state E and a distribution of a memory cell having the first program state P1. Each of second through seventh read voltages Vr2 through Vr7 have a voltage level between distributions of memory cells having adjacent program states.

In example embodiments, assuming that the first read voltage Vr1 is applied, when a memory cell is turned on, data '1' may be stored, and when the memory cell is turned off, data '0' may be stored. However, embodiments of the present disclosure are not limited thereto. For example, according to example embodiments, assuming that the first read voltage Vr1 is applied, when a memory cell is turned on, data '0' may be stored, and when the memory cell is turned off, data '1' may be stored. As such, a logic level of data may vary according to embodiments of the present disclosure.

Figure 11:
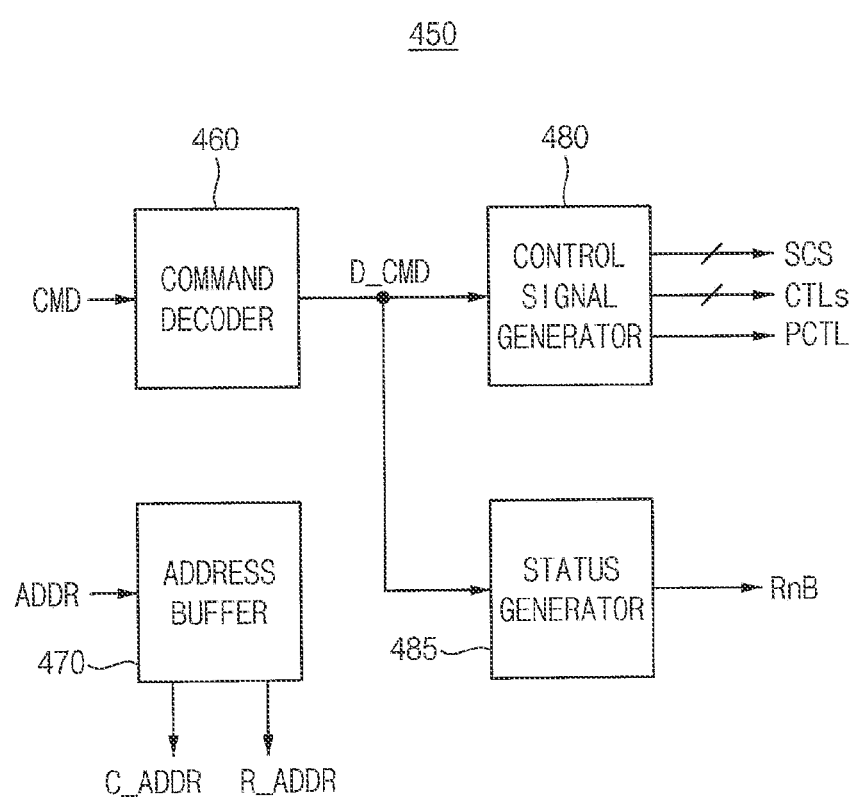
FIG. 11 is a block diagram illustrating the control circuit in the nonvolatile memory device of FIG. 2 according to example embodiments.

FIG. 11 is a block diagram illustrating the control circuit in the nonvolatile memory device of FIG. 2 according to example embodiments.

Referring to FIG. 11, the control circuit 450 may include a command decoder 460, an address buffer 470, a control signal generator 480 and a status signal generator 485.

The command decoder 460 may decode the command CMD and provide a decoded command D_CMD to the control signal generator 480 and the status signal generator 485.

The address buffer 470 may receive the address signal ADDR, provide the row address R_ADDR to the first address decoder 300a and the second address decoder 300b, and provide the column address C_ADDR to the data I/O circuit 420.

The control signal generator 480 may receive the decoded command D_CMD, may generate the control signals CTLs based on an operation directed by the decoded command D_CMD, and provide the control signals CTLs to the voltage generation circuit 500. The control signal generator 480 may generate the page buffer control signal PCTL based on an operation directed by the decoded command D_CMD to provide the page buffer control signal PCTL to the page buffer circuit 410, and may generate the switching control signals SCS to provide the switching control signals SCS to the address decoder 300.

The status signal generator 485 may receive the decoded command D_CMD, may monitor an operation directed by the decoded command D_CMD, and may transition the status signal RnB one of a ready state or a busy state based on whether the operation directed by the decoded command D_CMD is completed.

Figure 12:
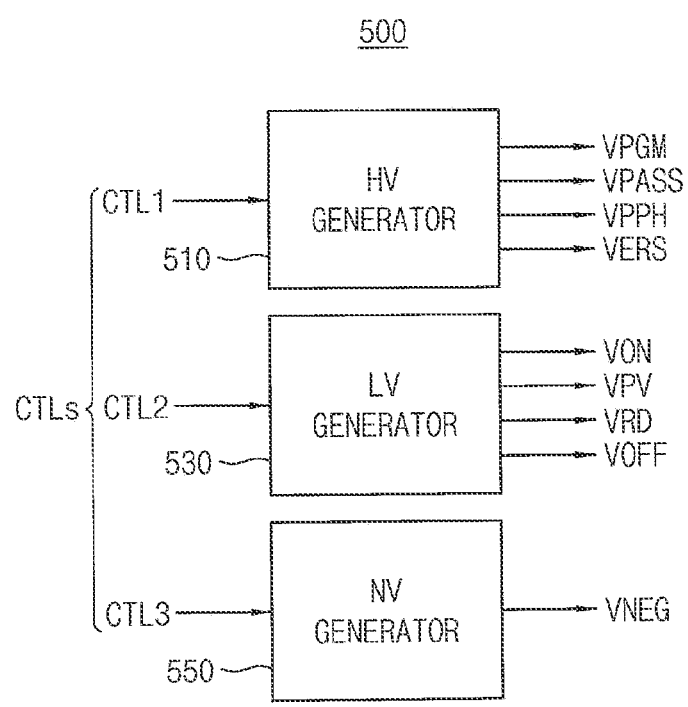
FIG. 12 is a block diagram illustrating the voltage generation circuit in the nonvolatile memory device of FIG. 2 according to example embodiments.

FIG. 12 is a block diagram illustrating the voltage generation circuit in the nonvolatile memory device of FIG. 2 according to example embodiments.

Referring to FIG. 12, the voltage generation circuit 500 may include a high voltage (HV) generator 510 and a low voltage (LV) generator 530. The voltage generation circuit 500 may further include a negative voltage (NV) generator 550.

The high voltage generator 510 may generate a program voltage PGM, a pass voltage VPASS, a high voltage VPPH and an erase voltage VERS according to operations directed by the command CMD, in response to a first control signal CTL1.

The program voltage PGM may be applied to the selected word-line, the pass voltage VPASS may be applied to the unselected word-lines, the erase voltage VERS may be applied to the well of the memory block or each drain of pass transistors coupled to a bit-line and a common source line. The high voltage VPPH may be applied to each gate of pass transistors coupled to word-lines, a string selection line and a ground selection line. The first control signal CTL1 may include a plurality of bits which indicate the operations directed by the decoded command D_CMD.

The low voltage generator 530 may generate a program verification voltage VPV, a read voltage VRD, a turn-on voltage VON and a turn-off voltage VOFF according to operations directed by the command CMD, in response to a second control signal CTL2. The program verification voltage VPV and the read voltage VRD may be applied to the selected word-line according to operation of the nonvolatile memory device 100. The turn-on voltage VON and the turn-off voltage VOFF may be applied to the string selection line and the ground selection line to control the turning on and turning off of the string selection transistor and the ground selection transistor. The second control signal CTL2 may include a plurality of bits which indicate the operations directed by the decode command D_CMD.

The negative voltage generator 550 may generate a negative voltage VNEG which has a negative level according to operations directed by the command CMD, in response to a third control signal CTL3. The third control signal CTL3 may include a plurality of bits which indicate the operations directed by the decoded command D_CMD. The negative voltage VNEG may be applied to a selected word-line and unselected word-lines during a program recovery period and may be applied to the unselected word-lines during a bit-line set-up period.

Figure 13:
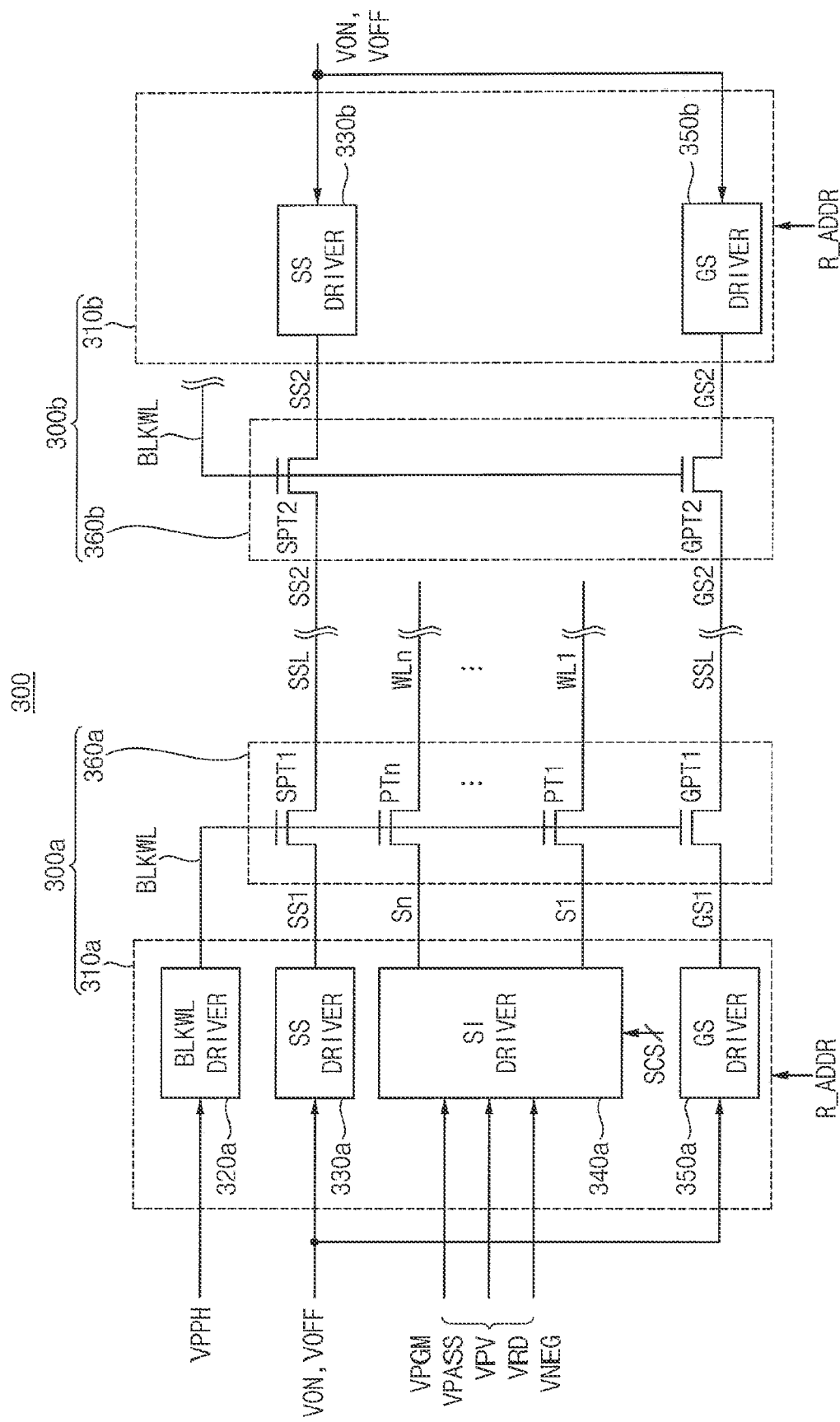
FIG. 13 is a block diagram illustrating an example of the first address decoder and the second address decoder in the nonvolatile memory device of FIG. 2 according to example embodiments.

FIG. 13 is a block diagram illustrating an example of the first address decoder and the second address decoder in the nonvolatile memory device of FIG. 2 according to example embodiments.

Referring to FIG. 13, the first address decoder 300a may include a first driver circuit 310a and a first pass switch circuit 360a. Herein, the terms "first pass switch circuit" and "first pass transistor circuit" may be used interchangeably. The second address decoder 300b may include a second driver circuit 310b and a second pass switch circuit 360b. Herein, the terms "second pass switch circuit" and "second pass transistor circuit" may be used interchangeably. The first address decoder 300a may be referred to as a first row decoder and the second address decoder 300b may be referred to as a second row decoder.

The first driver circuit 310a may transfer voltages provided from the voltage generation circuit 500 to the memory cell array 200 in response to a block address. The first driver circuit 310a may include a block selection driver BWLWL DRIVER 320a, a first string selection driver SS DRIVER 330a, a word-line driver SI DRIVER 340a and a first ground selection driver GS DRIVER 350a.

The second driver circuit 310b may transfer a portion of the voltages provided from the voltage generation circuit 500 to the memory cell array 200 in response to the block address. The second driver circuit 310ba may include a second string selection driver SS DRIVER 330b and a second ground selection driver GS DRIVER 350b.

The block selection driver 320a may supply the high voltage VPPH from the voltage generation circuit 500 to the first pass transistor circuit 360a and the second pass transistor circuit 360b in response to the block address. The block selection driver 320a may supply the high voltage VPPH to a block word-line BLKWL coupled to gates of a plurality of first pass transistors GPT1, PT1~PTn and SPT1 in the first pass transistor circuit 360a and coupled to gates of a plurality of second pass transistors GPT2 and SPT2 in the second pass transistor circuit 360b. Here, n is an integer greater than one. The block selection driver 320a may control the application of various voltages such as, for example, a pass voltage, a program voltage, a read voltage to the memory cell array 200.

The first pass transistors GPT1, PT1~PTn and SPT1 may include a first ground pass transistor GPT1, a plurality of word-line pass transistors PT1~PTn and a first string pass transistor SPT1. The second pass transistors GPT2 and SPT2 may include a second ground pass transistor GPT2 and a second string pass transistor SPT2.

The first string selection driver 330a may supply the turn-on voltage VON and the turn-off voltage VOFF from the voltage generation circuit 500 to the string selection line SSL through the first string pass transistor SPT1 as a string selection signal SS1. The second string selection driver 330b may supply the turn-on voltage VON and the turn-off voltage VOFF from the voltage generation circuit 500 to the string selection line SSL through the second string pass transistor SPT2 as a string selection signal SS2. During a program operation, the first string selection driver 330a and the second string selection driver 330b may supply the selection signals SS1 and SS2 so as to turn on all string selection transistors in a selected memory block.

The driving line driver 340a may supply the program voltage VPGM, the pass voltage VPASS, the verification voltage VPV, the read voltage VRD, and the negative voltage VNEG from the voltage generation circuit 500 to word-lines WL1~WLn through driving lines S1~Sn and the word-line pass transistors PT1~PTn.

The first ground selection driver 350a may supply the turn-on voltage VON and the turn-off voltage VOFF from the voltage generation circuit 500 to the ground selection line GSL through the first ground pass transistor GPT1 as a ground selection signal GS1. The second ground selection driver 350b may supply the turn-on voltage VON and the turn-off voltage VOFF from the voltage generation circuit 500 to the ground selection line GSL through the second ground pass transistor GPT2 as a ground selection signal GS2.

The first pass transistors GPT1, PT1~PTn and SPT1 and the second pass transistors GPT2 and SPT2 are configured such that the ground selection line GSL, the word-lines WL1~WLn and the string selection line SSL are electrically connected to corresponding driving lines, in response to activation of the high voltage VPPH on the block word-line BLKWL. In example embodiments, each of the first pass transistors GPT1, PT1~PTn and SPT1 and the second pass transistors GPT2 and SPT2 may include a high voltage transistor capable of enduring high-voltage.

The first pass transistors GPT1, PT1~PTn and SPT1 may be connected to the block word-line BLKWL by upper conductive lines and lower conductive lines of the nonvolatile memory device 100. The second pass transistors GPT2 and SPT2 may be connected to the block word-line BLKWL by the lower conductive lines of the nonvolatile memory device 100. Therefore, upper conductive lines disposed above the second address decoder 300b may be eliminated, and thus, freedom of wiring at a portion of the second address decoder 300b may increase.

Figure 14:
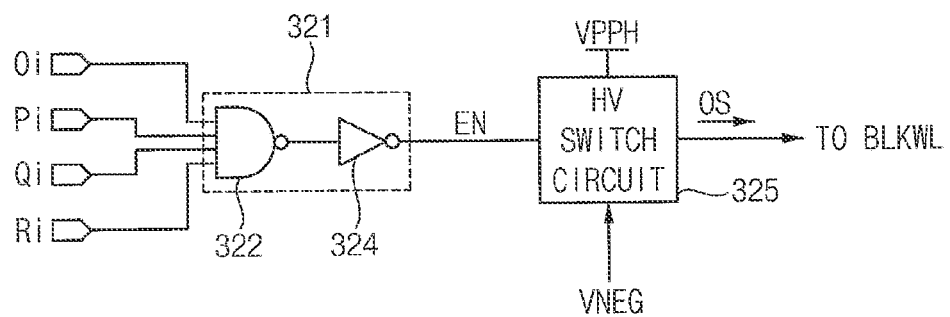
FIG. 14 is a block diagram illustrating an example of the block selection driver in the first address decoder in FIG. 13 according to example embodiments.

FIG. 14 is a block diagram illustrating an example of the block selection driver in the first address decoder in FIG. 13 according to example embodiments.

Referring to FIG. 14, the block selection driver 320a may include a pre-decoder 321 and a high voltage switch circuit 325.

The pre-decoder 321 may include a NAND gate 322 and an inverter 324.

The NAND gate 322 may perform a NAND operation on decoding signals Oi, Pi, Qi and Ri that are provided by the row address R_ADDR. The inverter 324 may invert an output of the NAND gate 322. An output of the inverter 324 may be transmitted to the high voltage switch circuit 325 as a low voltage block selection signal (e.g., an enable signal EN).

When all of the decoding signals Oi, Pi, Qi and Ri are activated, the enable EN may be set to a high level. The high voltage switch circuit 325 may receive the high voltage VPPH and the negative voltage VNEG, may shift a voltage level of the enable signal EN, and may output a boosted block selection signal (e.g., an output signal OS) that swings between the high voltage VPPH and the negative voltage VNEG. The block selection signal may be transferred to the block word-line BLKWL. The first pass transistors GPT1, PT1~PTn and the SPT1 and the second pass transistors GPT2 and SPT2 may be switched by the block selection signal transferred through the block word-line BLKWL.

Figure 15:
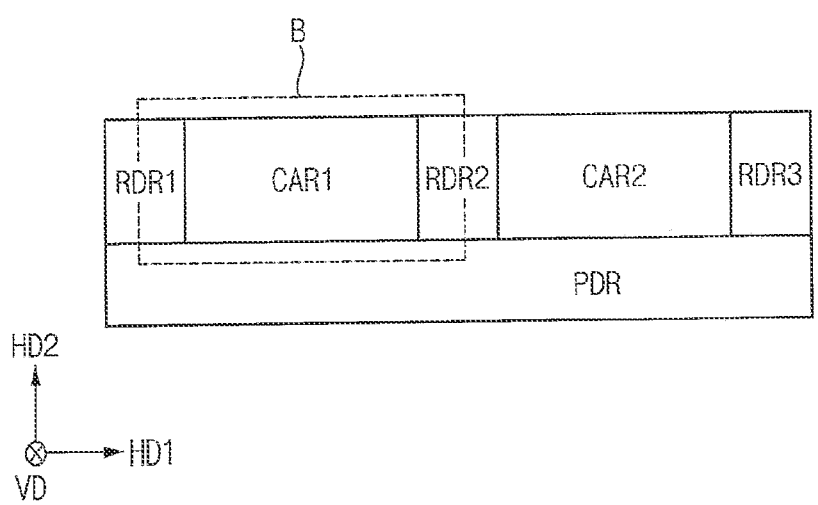
FIG. 15 is an example layout diagram illustrating a nonvolatile memory device according to example embodiments.

FIG. 15 is an example layout diagram illustrating a nonvolatile memory device according to example embodiments.

Referring to FIG. 15, the nonvolatile memory device 100 may include a first row decoder region RDR1, a first cell array region CAR1, a second row decoder region RDR2, a second cell array region CAR2, and a third row decoder region RDR3, which are disposed consecutively in the first horizontal direction HD1.

The nonvolatile memory device 100 may further include a pad region PDR disposed adjacent to the first row decoder region RDR1, the first cell array region CAR1, the second row decoder region RDR2, the second cell array region CAR2, and the third row decoder region RDR3 in the second horizontal direction HD2.

The first row decoder region RDR1, the first cell array region CAR1, the second row decoder region RDR2, the second cell array region CAR2, and the third row decoder region RDR3 may extend in the second horizontal direction HD2, and the pad region PDR may extend in the first horizontal direction HD1.

At least one memory block including a plurality of nonvolatile memory cells may be provided in each of the first cell array region CAR1 and the second cell array region CAR2.

A first type (e.g., a high voltage type) of address decoder may be disposed in the first row decoder region RDR1. The first type of address decoder may drive at least one selection line, a plurality of word-lines, and at least one ground selection line of the first cell array region CAR1.

A second type (e.g., a low voltage type) of address decoder may be disposed in the second row decoder region RDR2. The second type of address decoder may drive at least one selection line and at least one ground selection line of each of the first cell array region CAR1 and the second cell array region CAR2.

Another first type of address decoder may be disposed in the third row decoder region RDR2. This another first type of address decoder may drive at least one selection line, a plurality of word-lines, and at least one ground selection line of the second cell array region CAR2.

Power pads including a power supply voltage pad and a ground voltage pad and data pads may be disposed in the pad region PDR.

A portion B of the nonvolatile memory device 100 will be described with reference to FIG. 16.

Figure 16:
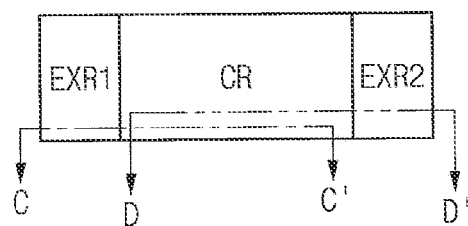
FIG. 16 illustrates a portion in the nonvolatile memory device in detail according to example embodiments.

FIG. 16 illustrates a portion in the nonvolatile memory device in detail according to example embodiments.

Referring to FIG. 16, the portion B may include a cell region (or a cell array region) CR, a first extension region EXR1 disposed adjacent to a first side of the cell region CR, and a second extension region EXR2 disposed adjacent to a second side of the cell array region CR. The second side of the cell region CR may be opposed to the first side of the cell region CR.

A plurality of memory cells, a plurality of word-lines, at least one string selection line, at least one ground selection line, and a plurality of bits-lines may be provided in the cell region CA, and a plurality of first connection elements may be provided in the first extension region EXR1. The plurality of first connection elements may electrically connect the first address decoder 300a to the plurality of word-lines, the at least one string selection line, and the at least one ground selection line. A plurality of second connection elements may be provided in the second extension region EXR2. The plurality of second connection elements may electrically connect the second address decoder 300b to the at least one string selection line and the at least one ground selection line.

Figure 17:
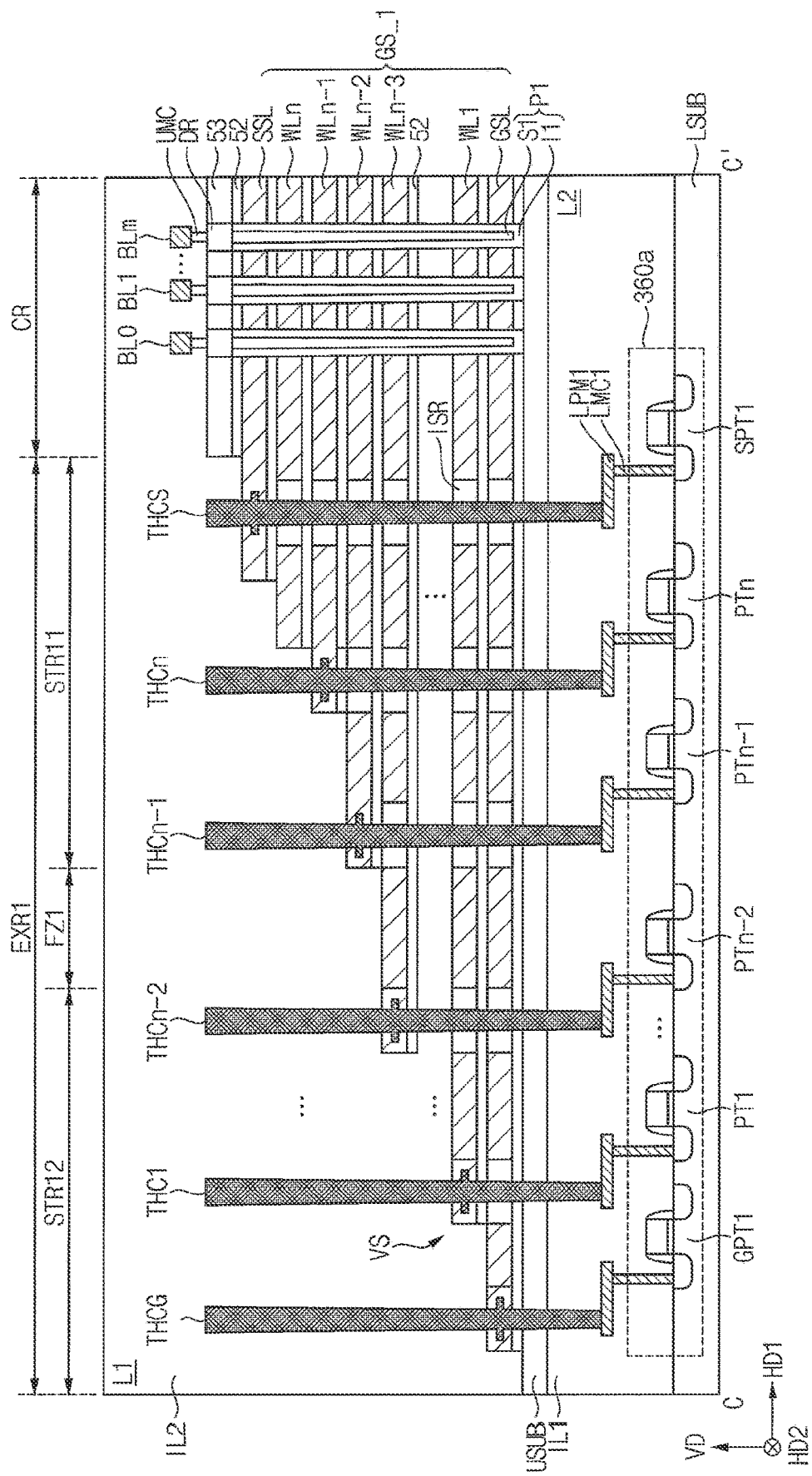
FIG. 17 is a cross-sectional view of an example of the portion taken along a line C-C' in the portion of FIG. 16.
Figure 18:
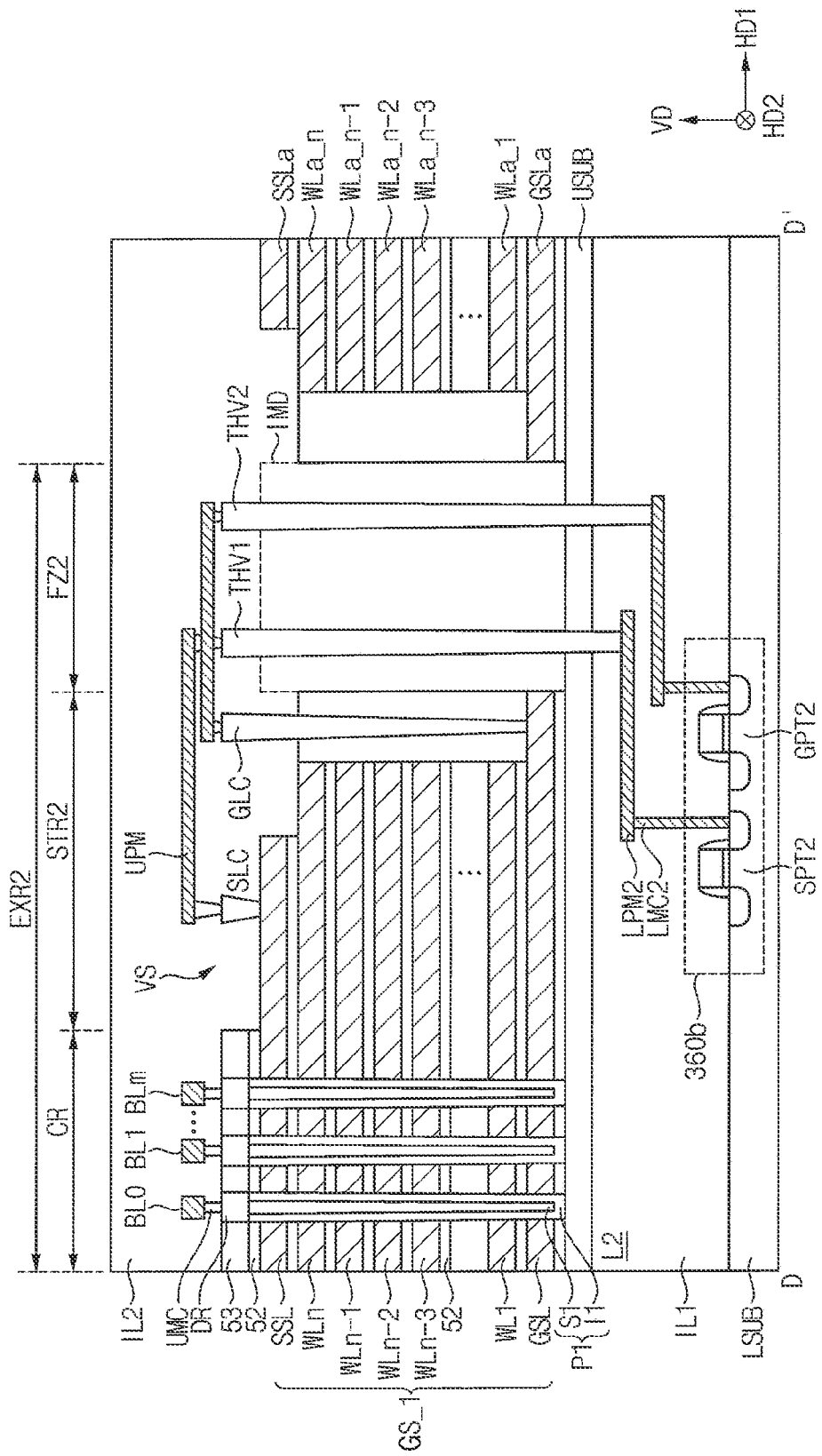
FIG. 18 is a cross-sectional view of an example of the portion taken along a line D-D' in the portion of FIG. 16.

FIG. 17 is a cross-sectional view of an example of the portion taken along a line C-C' in the portion of FIG. 16. FIG. 18 is a cross-sectional view of an example of the portion taken along a line D-D' in the portion of FIG. 16.

Referring to FIGS. 16, 17 and 18, the second semiconductor layer L2 may include a lower substrate LSUB, the first pass switch circuit 360a, and the second pass switch circuit 360b. The first pass switch circuit 360a and the second pass switch circuit 360b may be provided (or formed) in the lower substrate LSUB.

In addition, the second semiconductor layer L2 may include lower contacts LMC1 electrically connected to the first address decoder 300a, lower conductive lines LPM1 electrically connected to the lower contacts LMC1, lower contacts LMC2 electrically connected to the second address decoder 300b, lower conductive lines LPM2 electrically connected to the lower contacts LMC2, and a lower insulating layer IL1 covering the lower contacts LMC1 and LMC2 and the lower conductive lines LPM1 and LPM2.

The first pass switch circuit 360a may be provided (or formed) in a first portion of the lower substrate LSUB. The first pass switch circuit 360a may be provided by forming a plurality of first pass transistors including the first ground pass transistor GPT1, the plurality of word-line pass transistors PT1~PTn, and the first string pass transistor SPT1 in the first portion of the lower substrate LSUB.

The second pass switch circuit 360b may be provided (or formed) in a second portion of the lower substrate LSUB. The second pass switch circuit 360b may be provided by forming a plurality of second pass transistors including the second ground pass transistor GPT2 and the second string pass transistor SPT1 in the second portion of the lower substrate LSUB.

The first semiconductor layer L1 may include the cell region CR, the first extension region EXR1, and the second extension region EXR2. The first extension region EXR1 may be formed adjacent to the first side of the cell region CR in the second horizontal direction HD2. The second extension region EXR2 may be formed adjacent to the second side of the cell array region CR, opposed to the first side of the cell array region CR, in the second horizontal direction HD2. The first extension region EXR1 may include a first step zone (or a stair region) STR11, a second step zone STR12, and a first flat zone FZ1 disposed between the first step zone STR11 and the second step zone STR12. The second extension region EXR1 may include a third step zone STR2 and a second flat zone FZ2. The second flat zone FZ2 may include an insulating mold structure IMD. The first step zone STR11 may have a stepped shape that descends from the first side of the cell region CR, and the second step zone STR12 may have a stepped shape that descends from a periphery of the first flat zone FZ1. The third step zone STR2 may have a stepped shape that descends from the second side of the cell region CR.

The first semiconductor layer L1 may include an upper substrate USUB, a vertical structure VS, and the insulating mold structure IMD. The vertical structure VS and the insulating mold structure IMD may be formed on the upper substrate USUB.

In addition, the first semiconductor layer L1 may include upper contacts UMC, bit-lines BL0 through BLm, a string selection line contact SLC, a ground selection line contact GLC, and upper conductive lines UPM that are electrically connected to the vertical structure VS.

Additionally, the first semiconductor layer L1 may include the through-hole vias THV1 and THV2 formed in the insulating mold structure IMD2 and electrically connected to string selection line contact SLC and the ground selection line contact GLC. The first semiconductor layer L1 may further include an upper insulating layer IL2 covering the vertical structure VS, the insulating mold structure IMD2, and various conductive lines.

The upper substrate USUB may be a support layer that supports a gate conductive layer GS_1. For example, the upper substrate USUB may be referred to as a base substrate.

The vertical structure VS may include the gate conductive layer GS_1 located on the upper substrate USUB, and pillars P1 that penetrate or pass through the gate conductive layer GS_1 and extend in the vertical direction VD on a top surface of the upper substrate USUB. The gate conductive layer GS_1 may include the ground selection line GSL, the plurality of word-lines WL1~WLn, and the string selection line SSL. The ground selection line GSL, the plurality of word-lines WL1~WLn, and the string selection line SSL may be sequentially formed on the upper substrate USUB, and insulating interlayers 52 may be located under or over each of the gate conductive layer GS_1. For example, the conductive layers (e.g., the ground selection line GSL, the word-lines WL1~WLn, and the string selection line SSL) including a conductive material, and the insulating interlayers 52 including an insulating material, may be alternately stacked in the vertical direction VD. The vertical structure VS may correspond to the cell region CR, the first extension region EXR1, and the second extension region EXR2.

Each of the pillars P1 may include a surface layer S1 and inside layer I1. For example, the surface layer S1 of the pillars P1 may include a silicon material doped with an impurity, or a silicon material not doped with an impurity.

For example, the ground selection line GSL and a portion of the surface layer S1 disposed adjacent to the ground selection line GSL may form a ground selection transistors (e.g., the ground selection transistor GST in FIG. 5). In addition, the word-lines WL1~WLn and a portion of the surface layer S1 disposed adjacent to the word-lines WL1~WLn may form memory cells (e.g., the memory cells MC1 to MC8 in FIG. 5). Further, the string selection line SSL and a portion of the surface layer S1 disposed adjacent to the string selection line SSL may form a string selection transistor (e.g., the string selection transistor SST in FIG. 5).

Drain regions DR may be formed on the pillars P1. The drain regions DR may be electrically connected to the bit-lines BL0~BLm by the upper contacts UMC. For example, the drain regions DR may include a silicon material doped with an impurity. An etch-stop layer 53 may be formed on a side wall of the drain regions DR. A top surface of the etch-stop layer 53 may be formed on the same level as a top surface of the drain regions DR.

As illustrated in FIG. 17, a cross-section of a portion disposed in the first extension region EXR1 among the vertical structures VS may form a stepped shape. The stepped shape (or stepped pad shape) may be referred to as a "word-line pad." In addition, a flat zone may exist in the middle of the stepped shape.

The first semiconductor layer L1 may include a plurality of through-hall contacts THCG, THC1~THCn and THCS penetrating the first step zone STR11 and the second step zone STR12 (e.g., by penetrating insulating regions of the first step zone STR11 and the second step zone STR12) and connecting electrically each of the ground selection line GSL, the plurality of word-lines WL1~WLn and the string selection line SSL to respective one of the first ground pass transistor GPT1, the word-line pass transistors SPT1~SPTn and the first selection pass transistor SPT1. The plurality of through-hall contacts THCG, THC1~THCn and THCS may be formed by avoiding the first flat zone FZ1.

Because each of the plurality of through-hall contacts THCG, THC1~THCn and THCS is directly connected to respective lines of the ground selection line GSL, the plurality of word-lines WL1~WLn, and the string selection line SSL by penetrating conductive lines in the first step zone STR11 and the second step zone STR12 and the insulating interlayers 52, the upper contacts UMC and the upper conductive lines UPM above the first extension region EXR1 may be eliminated or may be used for connecting other elements.

Each of the plurality of through-hall contacts THCG, THC1~THCn and THCS may be connected to a target line by penetrating an insulating region ISR of lower lines.

Referring to FIG. 18, the insulating mold structure IMD may include insulating material that is filled in on the upper substrate USUB in the vertical direction VD. The through-hall vias THV1 and THV2 may be formed in the second flat zone FZ2 and may be formed by penetrating the insulating mold structure IMD. Thus, according to embodiments, there is no need to further form an insulating material surrounding the through-hole vias THV1 and THV2, which may increase efficiency in the manufacturing process.

In FIG. 18, a ground selection line GSLa, a plurality of word-lines WLa_1~Wla_n, and a string selection line SSLa may represent another cell region adjacent to the insulating mold structure IMD.

In FIG. 17, each gate of the first ground pass transistor GPT1, the word-line pass transistors SPT1~SPTn, and the first selection pass transistor SPT1 may be connected to the block word-line BLKWL by using lower conductive lines (lower wires) in the second semiconductor layer L2 and upper conductive lines (upper wires) in the first semiconductor layer L1.

In addition, in FIG. 18, each gate of the second ground pass transistor GPT2 and the second selection pass transistor SPT2 may be connected to the block word-line by using lower conductive lines (lower wires) in the second semiconductor layer L2.

Figure 19:
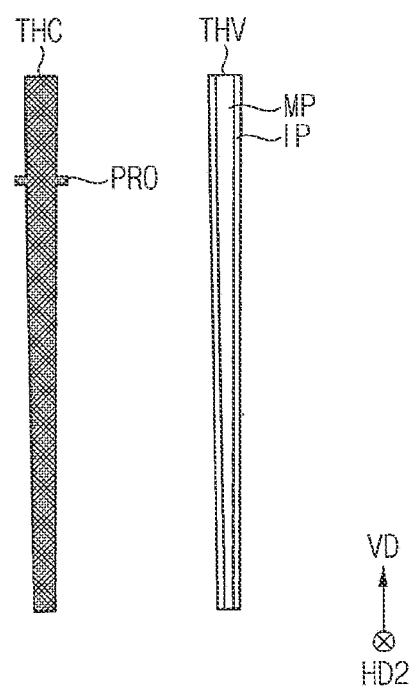
FIG. 19 illustrates an example of a through-hall contact and a through-hall via in FIGS. 17 and 18.

FIG. 19 illustrates an example of a through-hall contact and a through-hall via in FIGS. 17 and 18.

Referring to FIG. 19, a through-hall contact THC and a through-hall via THV may have the same height in the vertical direction VD, and the through-hall contact THC may have a protruding portion PRO that protrudes in the target line. The through-hall via THV may include an insulating layer pattern IP and a conductive pattern MP.

The through-hall contact THC may be formed by merging a through-hall via and a word-line contact, and thus, a size of the through-hall contact THC may be greater than a size of the string selection line contact SLC and a size of the ground selection line contact GLC in FIG. 18. That is, the through-hall contact THC may have a merged type of a through-hall via and a word-line contact.

Figure 20:
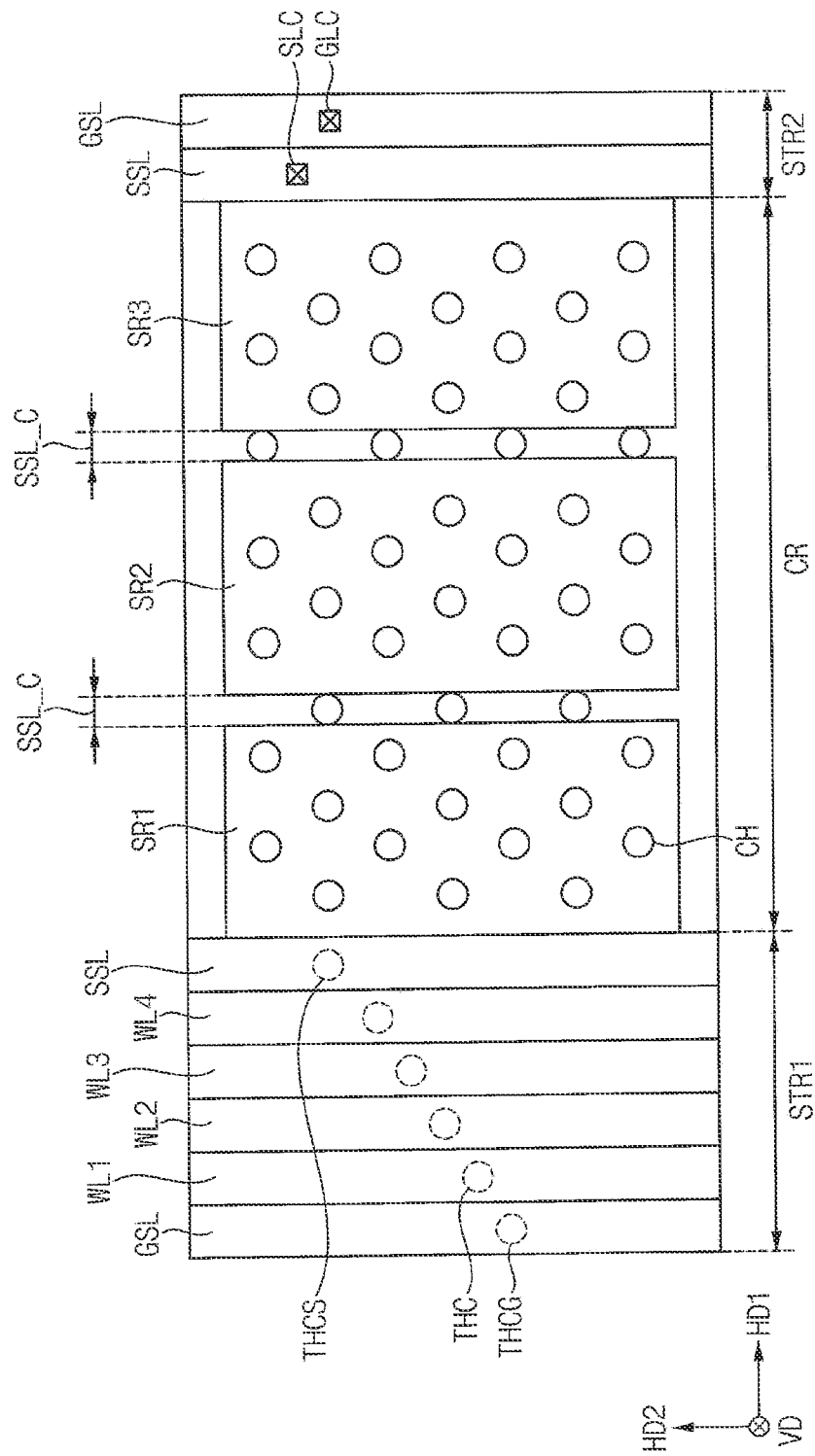
FIG. 20 is an example layout diagram illustrating a cell region, a first step zone, and a second step zone in FIGS. 17 and 18.

FIG. 20 is an example layout diagram illustrating a cell region, a first step zone, and a second step zone in FIGS. 17 and 18.

Referring to FIG. 20, the cell region CR may be divided into a plurality of sub regions SR1, SR2 and SR3 in the first horizontal direction HD1 by string selection line cuts SSL_C extending in the second horizontal direction HD2.

A plurality of vertical channels CH may be provided in the vertical direction VD in each of the plurality of sub regions SR1, SR2 and SR3.

The ground selection line GSL, word-lines WL1, WL2, WL3 and WL4 and the string selection line SSL in a step zone STR1 may be connected to corresponding pass transistors through through-hall contacts THCG, THC and THCS penetrating the step zone STR1. The step zone STR1 may correspond to the first step zone STR11 and the second step zone STR12 in FIG. 17. The ground selection line GSL and the string selection line SSL in a the step zone STR2 may be connected to corresponding pass transistors through selection line contacts GLC and SLC provided in the step zone STR2 and through-hall vias penetrating the insulating mold structure.

As a number of the vertical channels CH in the first horizontal direction HD1 disposed between the string selection line cuts SSL_C increases, a resistance of the string selection line in the sub region SR2 may increase. In a comparative example, when the resistance of the string selection line in the sub region SR2 increases, a word-line setup time may increase. However, in the nonvolatile memory device according to example embodiments, because the second address decoder 300b drives the second string pass transistor connected to the string selection line in the sub region SR2, performance degradation due to the increase of the resistance of the string selection line in the sub region SR2 may be prevented and/or reduced.

Figure 21:
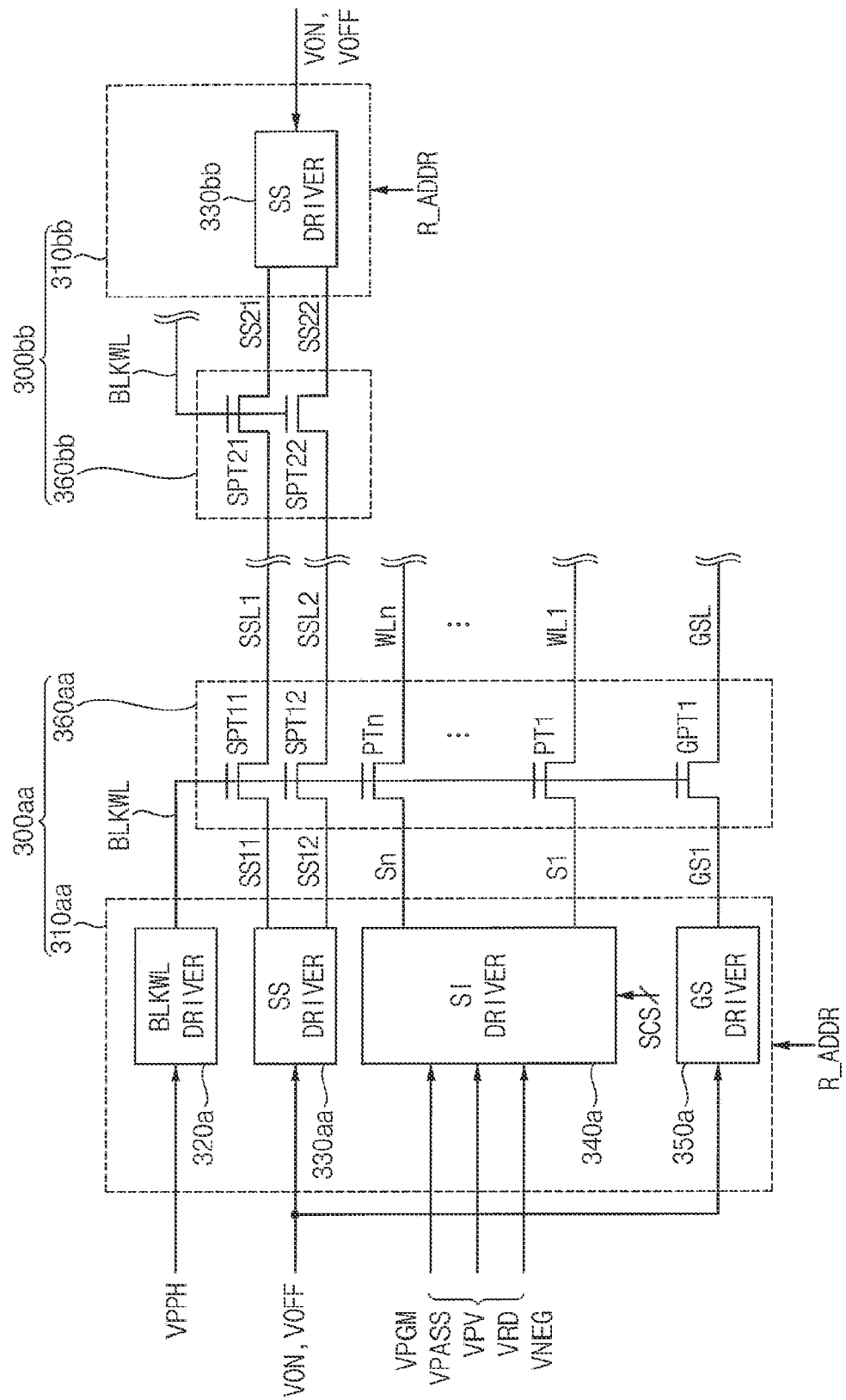
FIG. 21 is a block diagram illustrating another example of the first address decoder and the second address decoder in the nonvolatile memory device of FIG. 2 according to example embodiments.

FIG. 21 is a block diagram illustrating another example of the first address decoder and the second address decoder in the nonvolatile memory device of FIG. 2 according to example embodiments.

Referring to FIG. 21, a first address decoder 300aa may include a first driver circuit 310aa and a first pass switch circuit 360aa, and a second address decoder 300bb may include a second driver circuit 310bb and a second pass switch circuit 360bb.

The first driver circuit 310aa may transfer voltages provided from the voltage generation circuit 500 to the memory cell array 200 in response to a block address. The first driver circuit 310aa may include a block selection driver BWLWL DRIVER 320a, a first string selection driver SS DRIVER

330*aa*, a word-line driver SI DRIVER 340*a*, and a first ground selection driver GS DRIVER 350*a*.

The second driver circuit 310*bb* may transfer a portion of the voltages provided from the voltage generation circuit 500 to the memory cell array 200 in response to the block address. The second driver circuit 310*bb* may include a second string selection driver SS DRIVER 330*bb*.

The block selection driver 320*a* may supply the high voltage VPPH from the voltage generation circuit 500 to the first pass transistor circuit 360*aa* and the second pass transistor circuit 360*bb* in response to the block address. The block selection driver 320*a* may supply the high voltage VPPH to a block word-line BLKWL coupled to gates of a plurality of first pass transistors GPT1, PT1~PTn and SPT11 and SPT12 in the first pass transistor circuit 360*aa* and coupled to gates of a plurality of second pass transistors SPT21 and SPT22 in the second pass transistor circuit 360*bb*. The block selection driver 320*a* may control the application of various voltages such as, for example, a pass voltage, a program voltage, and a read voltage to the memory cell array 200.

The first string selection driver 330*aa* may supply the turn-on voltage VON and the turn-off voltage VOFF from the voltage generation circuit 500 to the string selection line SSL through string pass transistors SPT11 and SPT12 as string selection signal SS11 and SS12. The second string selection driver 330*bb* may supply the turn-on voltage VON and the turn-off voltage VOFF from the voltage generation circuit 500 to the string selection line SSL through string pass transistors SPT21 and SPT22 as string selection signals SS21 and SS22. During a program operation, the first string selection driver 330*aa* and the second string selection driver 330*bb* may supply the selection signals SS11, SS12, SS21 and SS22 so as to turn on all of string selection transistors in a selected memory block.

The driving line driver 340*a* may supply the program voltage VPGM, the pass voltage VPASS, the verification voltage VPV, the read voltage VRD, and the negative voltage VNEG from the voltage generation circuit 500 to word-lines WL1~WLn through driving lines S1~Sn and the word-line pass transistors PT1~PTn.

The first ground selection driver 350*a* may supply the turn-on voltage VON and the turn-off voltage VOFF from the voltage generation circuit 500 to the ground selection line GSL through the first ground pass transistor GPT1 as a ground selection signal GS1.

The first pass transistors GPT1, PT1~PTn, SPT11 and SPT12 and the second pass transistors SPT21 and SPT22 are configured such that the ground selection line GSL, the word-lines WL1~WLn, and string selection lines SSL1 and SSL2 are electrically connected to corresponding driving lines, in response to activation of the high voltage VPPH on the block word-line BLKWL. In example embodiments, each of the first pass transistors GPT1, PT1~PTn, SPT11 and SPT12 and the second pass transistors SPT21 and SPT22 may include a high voltage transistor capable of enduring high voltage.

The first pass transistors GPT1, PT1~PTn, SPT11 and SPT12 may be connected to the block word-line BLKWL by upper conductive lines and lower conductive lines of the nonvolatile memory device 100. The second pass transistors SPT21 and SPT22 may be connected to the block word-line BLKWL by the lower conductive lines of the nonvolatile memory device 100. Therefore, upper conductive lines above the second address decoder 300*bb* may be eliminated, and thus, wiring design options at a portion of the second address decoder 300*b* may increase.

The second address decoder 300*bb* in FIG. 21 may drive the string selection lines SSL1 and SSL2 differently from the second address decoder 300*b* in FIG. 13.

Figure 22:
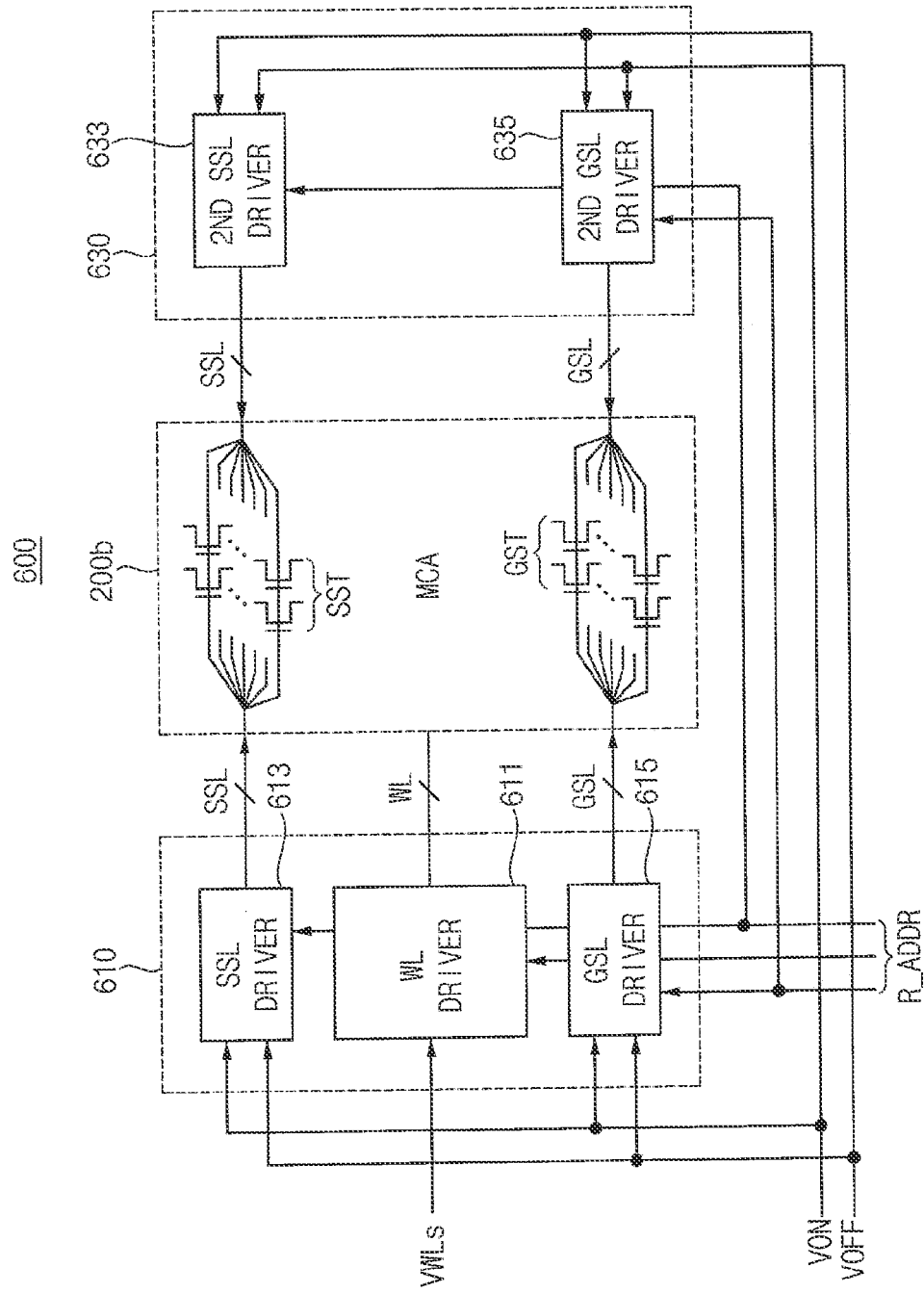
FIG. 22 is a block diagram illustrating a nonvolatile memory device according to example embodiments.

FIG. 22 is a block diagram illustrating a nonvolatile memory device according to example embodiments.

Referring to FIG. 22, a nonvolatile memory device 600 may include a memory cell array 200*b*, a first address decoder 610, and a second address decoder 630.

The first address decoder 610 may receive the word-line voltages VWLs, the turn-on voltage VON, and the turn-off voltage VOFF from the voltage generation circuit 500 in FIG. 2, and may receive the row address R_ADDR from the control circuit 450. The first address decoder 610 may transfer voltages provided from the voltage generation circuit 500 to the memory cell array 200*b* through string selection lines SSL, word-lines WL, and ground selection lines GSL.

The second address decoder 630 may receive the turn-on voltage VON and the turn-off voltage VOFF from the voltage generation circuit 500 in FIG. 2, and may receive the row address R_ADDR from the control circuit 450. The second address decoder 630 may transfer voltages provided from the voltage generation circuit 500 to the memory cell array 200*b* through the string selection lines SSL and the ground selection lines GSL.

The first address decoder 610 may include a word-line driver 611, a string selection line driver 613, and a ground selection line driver 615. The string selection line driver 613 may apply the turn-on voltage VON and the turn-off voltage VOFF to each of the string selection lines SSL based on the row address R_ADDR, the word-line driver 611 may apply the word-line voltages VWLs to the word-lines WL based on the row address R_ADDR, and the ground selection line driver 615 may apply the turn-on voltage VON and the turn-off voltage VOFF to each of the ground selection lines GSL based on the row address R_ADDR.

The string selection lines SSL may be coupled to string selection transistors SST, and the ground selection lines GSL may be coupled to the ground selection transistors GST.

The second address decoder 630 may include a string selection line driver 633 and a ground selection line driver 635. The string selection line driver 633 may apply the turn-on voltage VON and the turn-off voltage VOFF to each of the string selection lines SSL based on the row address R_ADDR, and the ground selection line driver 635 may apply the turn-on voltage VON and the turn-off voltage VOFF to each of the ground selection lines GSL based on the row address R_ADDR.

As described with reference to FIGS. 17 and 18, the first address decoder 610 may include first pass transistors provided in a portion under the first and second step zones in the first semiconductor layer, in the second semiconductor layer and the second address decoder 630 may include second pass transistors provided in a portion under the flat zone in the first semiconductor layer, in the second semiconductor layer. In addition, the first pass transistors may be connected to the string selection lines SSL, the word-lines WL, and the ground selection lines GSL through through-hall contacts penetrating the first and second step zones, and the second pass transistors may be connected to the string selection lines SSL and the ground selection lines GSL through through-hall vias penetrating an insulating mold structure in the flat zone and selection line contacts.

Accordingly, in the nonvolatile memory device 100 including vertical cell strings and a COP structure, the first address decoder 300*a* in the second semiconductor layer L2 drives the string selection line SSL, the word-lines WLs and the ground selection line GSL, and the second address decoder 300b in the second semiconductor layer L2 drives the string selection line SSL and the ground selection line GSL. In addition, through-hall contacts connecting first pass transistors in the first address decoder 300a to the string selection line SSL, the word-lines WLs, and the ground selection line GSL may be provided in a portion under the first side of the cell region CR by penetrating the first step zone STR11 and the second step zone STR12 in the first extension region EXR1 and through-hall vias connecting second pass transistors in the second address decoder 300b to the string selection line SSL, and the ground selection line GSL may be provided in a portion under the second side of the cell region CR by penetrating the insulating mold structure IMD in the second extension region EXR2. In addition, each gate of the first pass transistors may be connected to the block word-line by upper conductive lines in the first semiconductor layer L1 and lower conductive lines in the second semiconductor layer L2, and each gate of the second pass transistors may be connected to the block word-line by the lower conductive lines in the second semiconductor layer L2. Therefore, the nonvolatile memory device 100 may prevent and/or reduce performance degradation due to increase of resistance of the string selection and, may simplify wiring.

Figure 23:
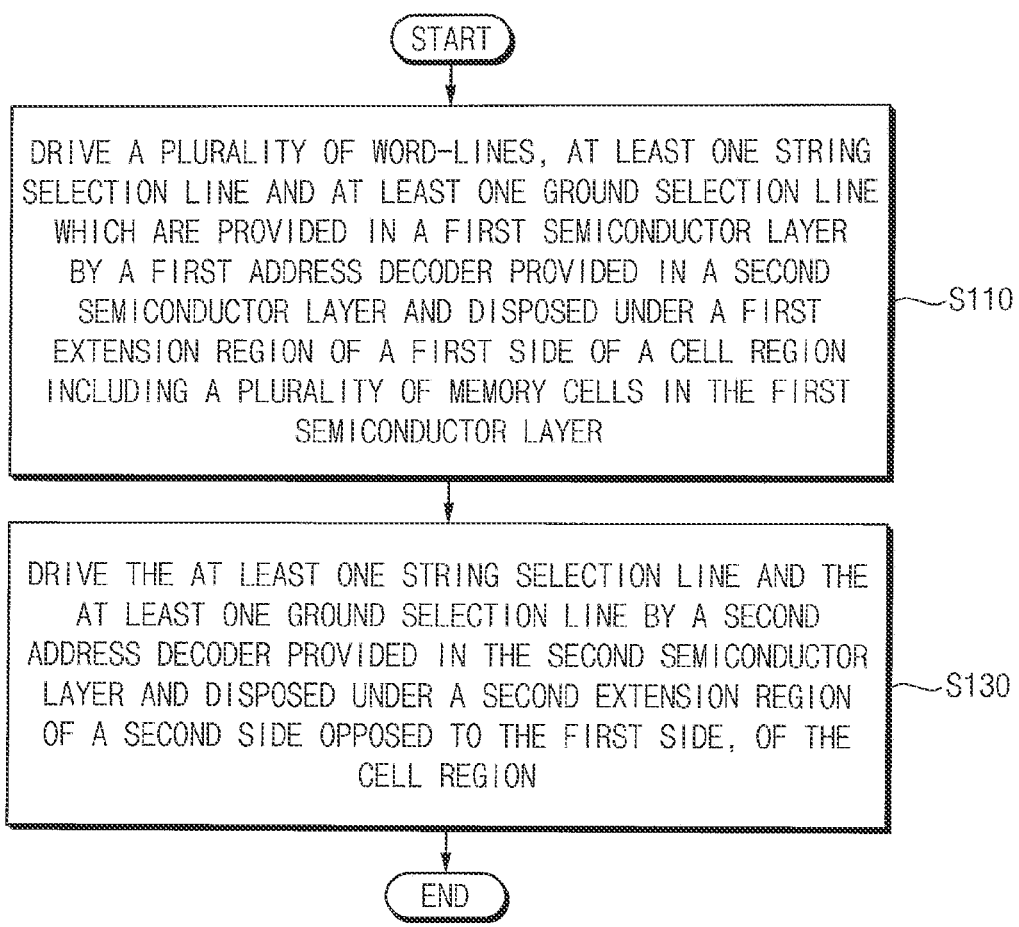
FIG. 23 is a flow chart illustrating a method of operating a nonvolatile memory device according to example embodiments.

FIG. 23 is a flow chart illustrating a method of operating a nonvolatile memory device according to example embodiments.

Referring to FIGS. 2 through 23, a first address decoder 300a, which is provided in a second semiconductor layer L2 and disposed under a first extension region EXR1 of a first side of a cell region CR including a plurality of memory cells in a first semiconductor layer L1, drives a plurality of word-lines, at least one string selection line, and at least one ground selection, line which are provided in the first semiconductor layer L1 (operation S110).

A second address decoder 300b, which is provided in the second semiconductor layer L2 and disposed under a second extension region EXR2 of a second side opposed to the first side, of the cell region CR, drives the at least one string selection line and the at least one ground selection line (operation S130).

FIG. 24 illustrates an example operation of driving by the first address decoder in FIG. 23.

Referring to FIGS. 17, 18, 23 and 24, for driving the plurality of word-lines, the at least one string selection line and the at least one ground selection line by the first address decoder 300a (operation S110), first pass transistors in the first address decoder 300a are electrically connected to the plurality of word-lines, the at least one string selection line, and the at least one ground selection line through through-hall contacts THC penetrating a stair region in the first extension region EXR1 (operation S115).

FIG. 25 illustrates an example operation of driving by the second address decoder in FIG. 23.

Referring to FIGS. 17, 18, 23 and 25, driving the at least one string selection line and the at least one ground selection line by the second address decoder 300b, second pass transistors in the second address decoder 300b are electrically connected to the at least one string selection line and the at least one ground selection line through through-hall vias THC penetrating an insulating mold structure in the second extension region and selection line contacts SLC and GLC (operation S135).

Figure 26:
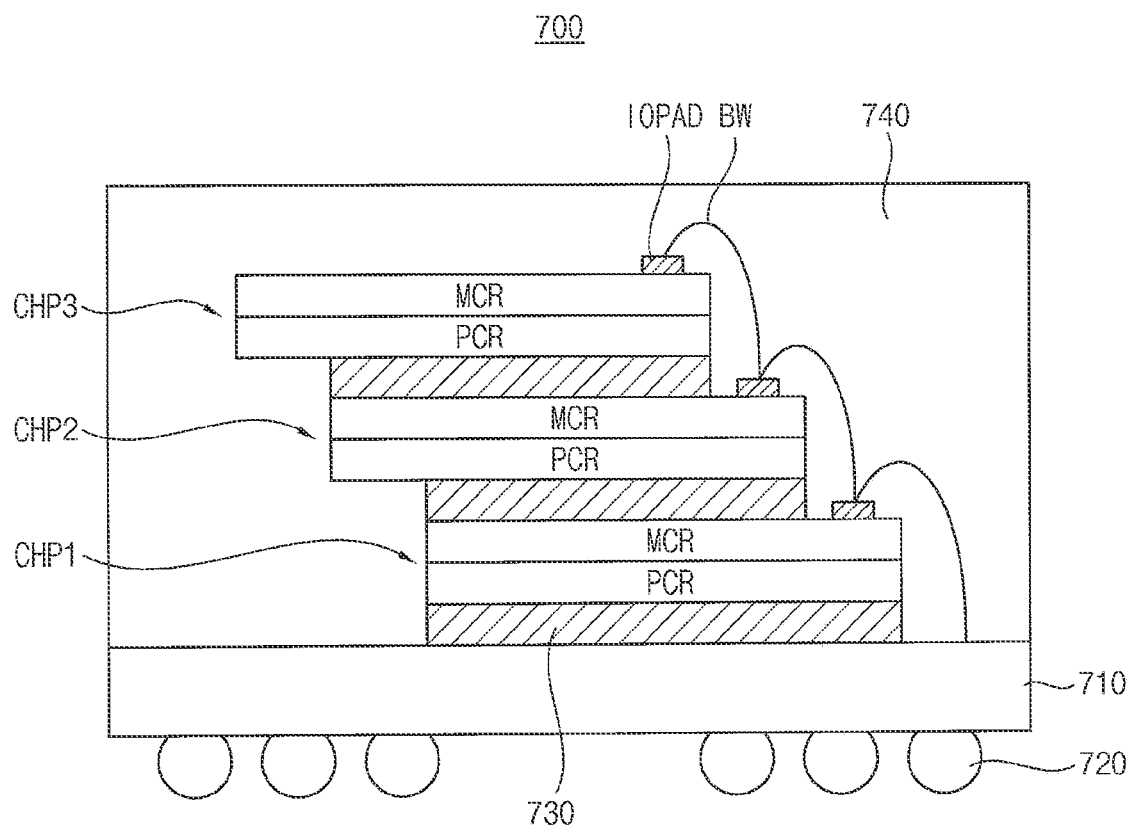
FIG. 26 is a cross-sectional view of a memory package according to example embodiments.

FIG. 26 is a cross-sectional view of a memory package according to example embodiments.

Referring to FIG. 26, a memory package 700 includes a base substrate 710 and a plurality of memory chips CHP1, CHP2 and CHP3 stacked on the base substrate 710.

Each of the memory chips CHP1 to CHP3 may include a peripheral circuit region PCR and a memory cell region MCR, and may further include a plurality of I/O pads IOPAD. The peripheral circuit region PCR and the memory cell region MCR in FIG. 26 may correspond to the second semiconductor layer L2 and the first semiconductor layer L1 described with reference to FIG. 3, respectively. The plurality of I/O pads IOPAD may be formed in the memory cell area MCR. The plurality of memory chips CHP1 to CHP3 may include the memory device according to example embodiments.

In some example embodiments, the plurality of memory chips CHP1 to CHP3 may be stacked on the base substrate 710 such that a surface on which the plurality of I/O pads IOPAD are formed faces upwards. For example, the plurality of memory chips CHP1 to CHP3 may be stacked in a downside-down state such that a second surface (e.g., a bottom surface) of the semiconductor substrate of each memory chip faces downwards. For example, with respect to each of the plurality of memory chips CHP1 to CHP3, the memory cell region MCR may be located on the peripheral circuit region PCR.

In some example embodiments, with respect to each of the plurality of memory chips CHP1 to CHP3, the plurality of I/O pads IOPAD may be arranged near one side of the semiconductor substrate. As such, the plurality of memory chips CHP1 to CHP3 may be stacked scalariformly, that is, in a step or ladder shape, such that the plurality of I/O pads IOPAD of each memory chip may be exposed. In such a stacked state, the plurality of memory chips CHP1 to CHP3 may be electrically connected to the base substrate 710 through a plurality of bonding wires BW.

The plurality of stacked memory chips CHP1 to CHP3 and the plurality of bonding wires BW may be fixed by a sealing member 740, and adhesive members 730 may intervene between the base substrate 710 and the plurality of memory chips CHP1 to CHP3. Conductive bumps 720 may be formed on a bottom surface of the base substrate 710 for electrical connections to the external device.

Figure 27:
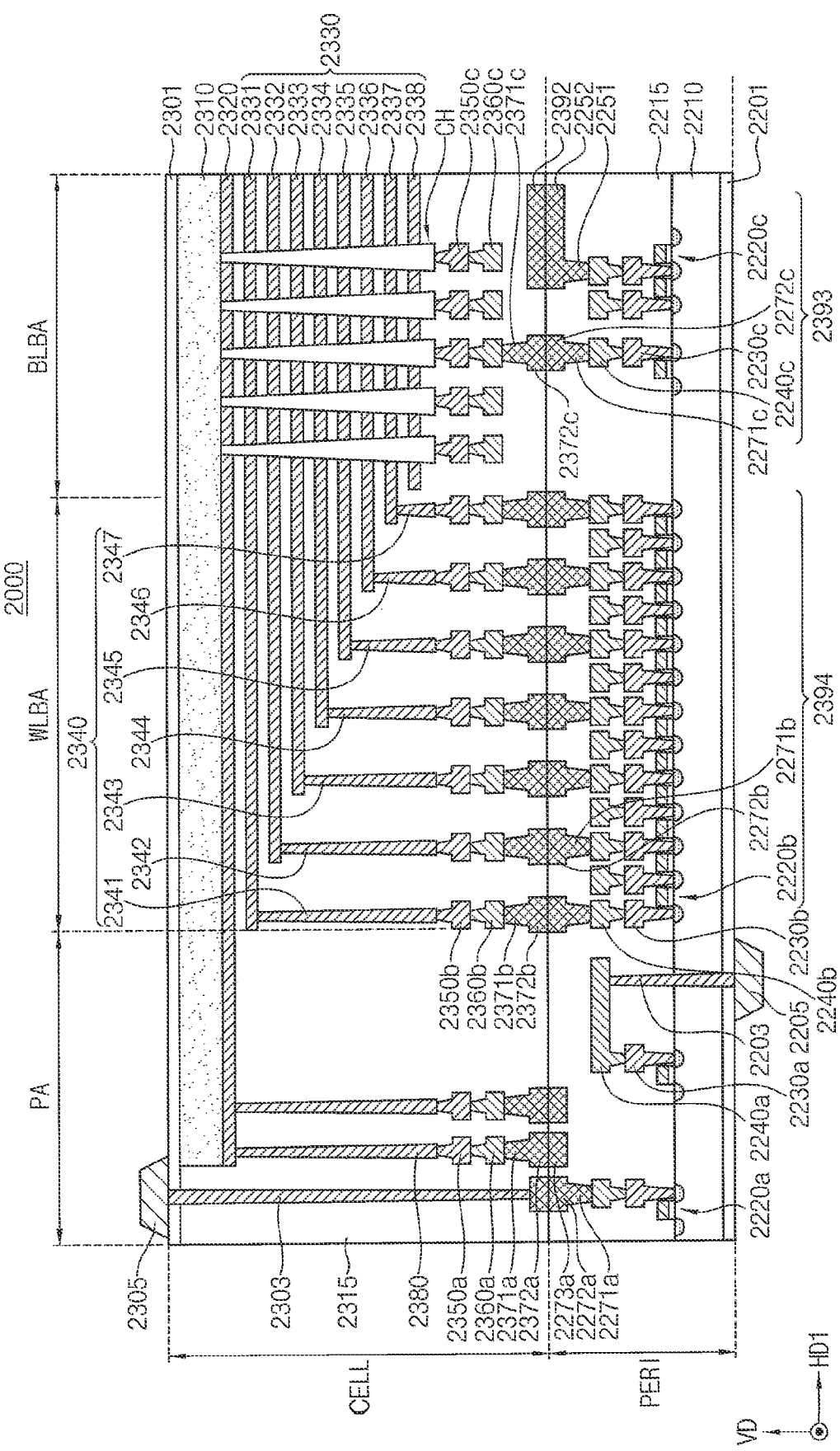
FIG. 27 is a cross-sectional view of a nonvolatile memory device according to example embodiments.

FIG. 27 is a cross-sectional view of a nonvolatile memory device according to example embodiments.

Referring to FIG. 27, a nonvolatile memory device or a memory device 2000 may have a chip-to-chip (C2C) structure. The C2C structure may refer to a structure formed by manufacturing an upper chip including a memory cell region or a cell region CELL on a first wafer, manufacturing a lower chip including a peripheral circuit region PERI on a second wafer, separate from the first wafer, and then bonding the upper chip and the lower chip to each other. Here, the bonding process may include a method of electrically connecting a bonding metal formed on an uppermost metal layer of the upper chip and a bonding metal formed on an uppermost metal layer of the lower chip. For example, when the bonding metals include copper (Cu), Cu-to-Cu bonding may be used. However, example embodiments are not limited thereto. For example, the bonding metals may also be formed of aluminum (Al) or tungsten (W).

Each of the peripheral circuit region PERI and the cell region CELL of the memory device 2000 may include an external pad bonding area PA, a word-line bonding area WLBA, and a bit-line bonding area BLBA.

The peripheral circuit region PERI may include a first substrate 2210, an interlayer insulating layer 2215, a plurality of circuit elements 2220a, 2220b, and 2220c formed on the first substrate 2210, first metal layers 2230*a*, 2230*b*, and 2230*c* respectively connected to the plurality of circuit elements 2220*a*, 2220*b*, and 2220*c*, and second metal layers 2240*a*, 2240*b*, and 2240*c* formed on the first metal layers 2230*a*, 2230*b*, and 2230*c*. In an example embodiment, the first metal layers 2230*a*, 2230*b*, and 2230*c* may be formed of tungsten having relatively high electrical resistivity, and the second metal layers 2240*a*, 2240*b*, and 2240*c* may be formed of copper having relatively low electrical resistivity.

Figure 28:
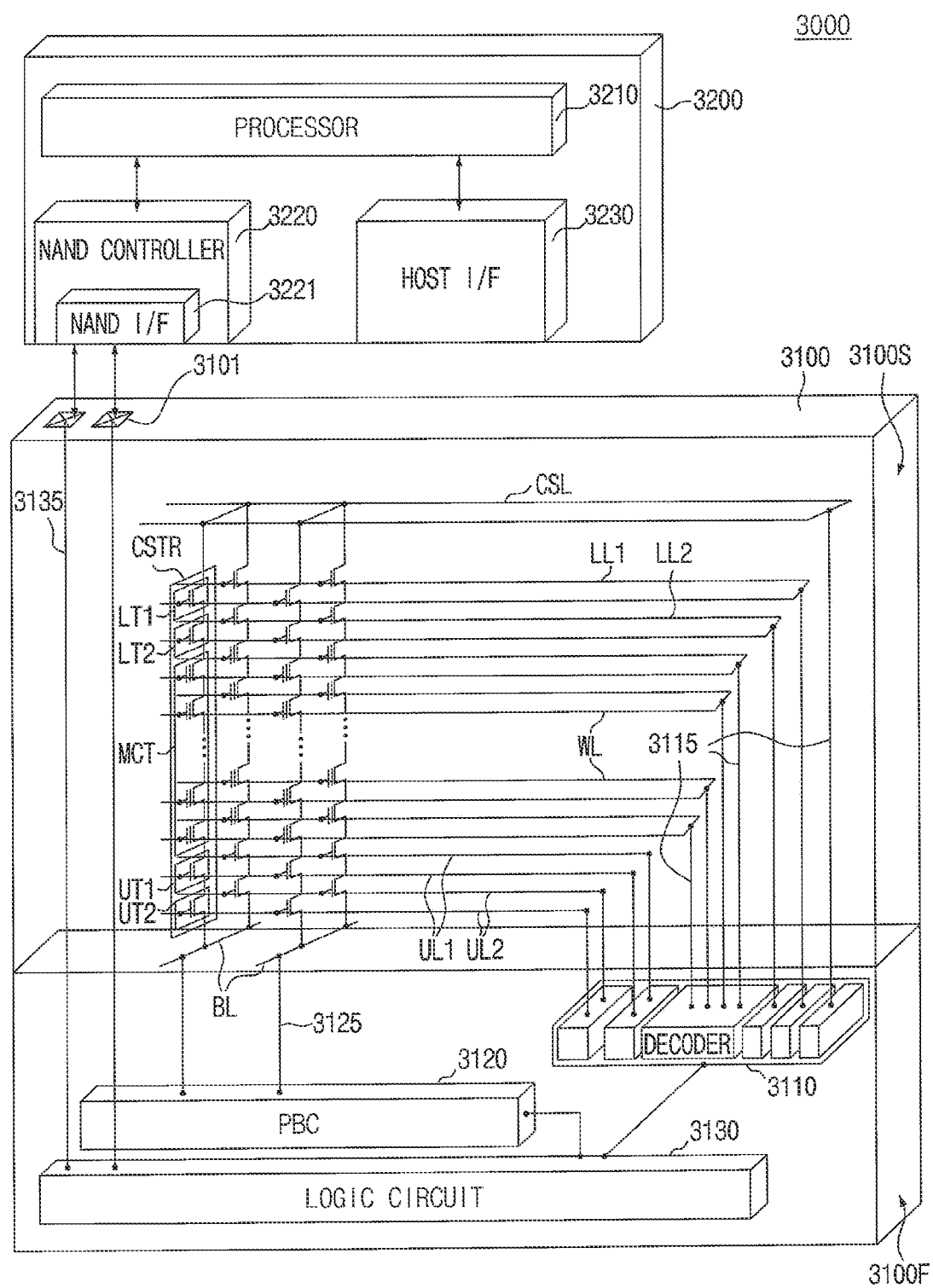
FIG. 28 is a block diagram illustrating an electronic system including a semiconductor device according to example embodiments.

In an example embodiment illustrated in FIG. 28, although only the first metal layers 2230*a*, 2230*b*, and 2230*c* and the second metal layers 2240*a*, 2240*b*, and 2240*c* are shown and described for convenience of illustration. However, example embodiments are not limited thereto, and one or more additional metal layers may be further formed on the second metal layers 2240*a*, 2240*b*, and 2240*c* according to example embodiments. At least a portion of the one or more additional metal layers formed on the second metal layers 2240*a*, 2240*b*, and 2240*c* may be formed of, for example, aluminum or the like having a lower electrical resistivity than those of copper forming the second metal layers 2240*a*, 2240*b*, and 2240*c*.

The interlayer insulating layer 2215 may be disposed on the first substrate 2210 and cover the plurality of circuit elements 2220*a*, 2220*b*, and 2220*c*, the first metal layers 2230*a*, 2230*b*, and 2230*c*, and the second metal layers 2240*a*, 2240*b*, and 2240*c*. The interlayer insulating layer 2215 may include an insulating material such as, for example, silicon oxide, silicon nitride, or the like.

Lower bonding metals 2271*b* and 2272*b* may be formed on the second metal layer 2240*b* in the word-line bonding area WLBA. In the word-line bonding area WLBA, the lower bonding metals 2271*b* and 2272*b* in the peripheral circuit region PERI may be electrically bonded to upper bonding metals 2371*b* and 2372*b* of the cell region CELL. The lower bonding metals 2271*b* and 2272*b* and the upper bonding metals 2371*b* and 2372*b* may be formed of, for example, aluminum, copper, tungsten, or the like. Further, the upper bonding metals 2371*b* and 2372*b* in the cell region CELL may be referred as first metal pads and the lower bonding metals 2271*b* and 2272*b* in the peripheral circuit region PERI may be referred as second metal pads.

The cell region CELL may include at least one memory block. The least one memory block may include a first region and a second region. The first region may store compensation data set and may correspond to an SLC block. The cell region CELL may include a second substrate 2310 and a common source line 2320. On the second substrate 2310, a plurality of word-lines 2331, 2332, 2333, 2334, 2335, 2336, 2337, and 2338 (e.g., 2330) may be stacked in a vertical direction VD (e.g., a Z-axis direction), substantially perpendicular to an upper surface of the second substrate 2310. At least one string selection line and at least one ground selection line may be arranged on and below the plurality of word-lines 2330, respectively, and the plurality of word-lines 2330 may be disposed between the at least one string selection line and the at least one ground selection line.

In the bit-line bonding area BLBA, a channel structure CH may extend in the vertical direction VD, substantially perpendicular to the upper surface of the second substrate 2310, and pass through the plurality of word-lines 2330, the at least one string selection line, and the at least one ground selection line. The channel structure CH may include, for example, a data storage layer, a channel layer, a buried insulating layer, and the like, and the channel layer may be electrically connected to a first metal layer 2350*c* and a second metal layer 2360*c*. For example, the first metal layer 2350*c* may be a bit-line contact, and the second metal layer 2360*c* may be a bit-line. In an example embodiment, the bit-line 2360*c* may extend in a second horizontal direction HD2 (e.g., a Y-axis direction), substantially parallel to the upper surface of the second substrate 2310.

In an example embodiment illustrated in FIG. 27, an area in which the channel structure CH, the bit-line 2360*c*, and the like are disposed may be defined as the bit-line bonding area BLBA. In the bit-line bonding area BLBA, the bit-line 2360*c* may be electrically connected to the circuit elements 2220*c* providing a page buffer circuit 2393 in the peripheral circuit region PERI. The bit-line 2360*c* may be connected to upper bonding metals 2371*c* and 2372*c* in the cell region CELL, and the upper bonding metals 2371*c* and 2372*c* may be connected to lower bonding metals 2271*c* and 2272*c* connected to the circuit elements 2220*c* of the page buffer circuit 2393.

In the word-line bonding area WLBA, the plurality of word-lines 2330 may extend in a first horizontal direction HD1 (e.g., an X-axis direction), substantially parallel to the upper surface of the second substrate 2310 and substantially perpendicular to the second horizontal direction HD2, and may be connected to a plurality of cell contact plugs 2341, 2342, 2343, 2344, 2345, 2346, and 2347 (e.g., 2340). The plurality of word-lines 2330 and the plurality of cell contact plugs 2340 may be connected to each other in pads provided by at least a portion of the plurality of word-lines 2330 extending in different lengths in the first horizontal direction HD1. A first metal layer 2350*b* and a second metal layer 2360*b* may be connected to an upper portion of the plurality of cell contact plugs 2340 connected to the plurality of word-lines 2330, sequentially. The plurality of cell contact plugs 2340 may be connected to the peripheral circuit region PERI by the upper bonding metals 2371*b* and 2372*b* of the cell region CELL and the lower bonding metals 2271*b* and 2272*b* of the peripheral circuit region PERI in the word-line bonding area WLBA.

The plurality of cell contact plugs 2340 may be electrically connected to the circuit elements 2220*b* forming an address decoder 2394 in the peripheral circuit region PERI. In an example embodiment, operating voltages of the circuit elements 2220*b* forming the address decoder 2394 may be different than operating voltages of the circuit elements 2220*c* forming the page buffer circuit 2393. For example, operating voltages of the circuit elements 2220*c* forming the page buffer circuit 2393 may be greater than operating voltages of the circuit elements 2220*b* forming the address decoder 2394. the circuit elements 2220*b* forming the address decoder 2394 may include the above-described first pass transistors and second pass transistors. The address decoder 2394 may also be referred to as a row decoder.

A common source line contact plug 2380 may be disposed in the external pad bonding area PA. The common source line contact plug 2380 may be formed of a conductive material such as, for example, a metal, a metal compound, polysilicon, or the like, and may be electrically connected to the common source line 2320. A first metal layer 2350*a* and a second metal layer 2360*a* may be stacked on an upper portion of the common source line contact plug 2380, sequentially. For example, an area in which the common source line contact plug 2380, the first metal layer 2350*a*, and the second metal layer 2360*a* are disposed may be defined as the external pad bonding area PA.

Input/output pads 2205 and 2305 may be disposed in the external pad bonding area PA. A lower insulating film 2201 covering a lower surface of the first substrate 2210 may be formed below the first substrate 2210, and a first input/output pad 2205 may be formed on the lower insulating film 2201. The first input/output pad 2205 may be connected to at least one of the plurality of circuit elements 2220a, 2220b, and 2220c disposed in the peripheral circuit region PERI through a first input/output contact plug 2203, and may be separated from the first substrate 2210 by the lower insulating film 2201. In addition, a side insulating film may be disposed between the first input/output contact plug 2203 and the first substrate 2210 to electrically separate the first input/output contact plug 2203 and the first substrate 2210.

An upper insulating film 2301 covering the upper surface of the second substrate 2310 may be formed on the second substrate 2310, and a second input/output pad 2305 may be disposed on the upper insulating layer 2301. The second input/output pad 2305 may be connected to at least one of the plurality of circuit elements 2220a, 2220b, and 2220c disposed in the peripheral circuit region PERI through a second input/output contact plug 2303 and/or lower bonding metals 2271a and 2272a, and the like. In the example embodiment, the second input/output pad 2305 is electrically connected to a circuit element 2220a.

According to embodiments, the second substrate 2310 and the common source line 2320 are not disposed in an area in which the second input/output contact plug 2303 is disposed. Also, according to embodiments, the second input/output pad 2305 does not overlap the word-lines 2330 in the vertical direction VD. The second input/output contact plug 2303 may be separated from the second substrate 2310 in the direction substantially parallel to the upper surface of the second substrate 310, and may pass through the interlayer insulating layer 2315 of the cell region CELL to be connected to the second input/output pad According to embodiments, the first input/output pad 2205 and the second input/output pad 2305 may be selectively formed. For example, the memory device 2000 may include only the first input/output pad 2205 disposed on the first substrate 2210 or the second input/output pad 2305 disposed on the second substrate 2310. Alternatively, the memory device 2000 may include both the first input/output pad 2205 and the second input/output pad 2305.

A metal pattern provided on an uppermost metal layer may be provided as a dummy pattern or the uppermost metal layer may be absent, in each of the external pad bonding area PA and the bit-line bonding area BLBA, respectively included in the cell region CELL and the peripheral circuit region PERI.

In the external pad bonding area PA, the memory device 2000 may include a lower metal pattern 2273a, corresponding to an upper metal pattern 2372a formed in an uppermost metal layer of the cell region CELL, and having the same cross-sectional shape as the upper metal pattern 2372a of the cell region CELL so as to be connected to each other, in an uppermost metal layer of the peripheral circuit region PERI. In the external pad bonding area PA, the memory device 2000 may include lower bonding metals 2271a and 2271b connected to the lower metal pattern 2273a. According to embodiments, in the peripheral circuit region PERI, the lower metal pattern 2273a formed in the uppermost metal layer of the peripheral circuit region PERI is not connected to a contact. Similarly, in the external pad bonding area PA, an upper metal pattern 2372a, corresponding to the lower metal pattern 2273a formed in an uppermost metal layer of the peripheral circuit region PERI, and having the same shape as a lower metal pattern 2273a of the peripheral circuit region PERI, may be formed in an uppermost metal layer of the cell region CELL. Similarly, in the external pad bonding area PA, an upper bonding metal 2371a may be formed and may be electrically connected to the upper metal pattern 2372a.

The lower bonding metals 2271b and 2272b may be formed on the second metal layer 2240b in the word-line bonding area WLBA. In the word-line bonding area WLBA, the lower bonding metals 2271b and 2272b of the peripheral circuit region PERI may be electrically connected to the upper bonding metals 2371b and 2372b of the cell region CELL by, for example, Cu-to-Cu bonding.

Further, in the bit-line bonding area BLBA, an upper metal pattern 2392, corresponding to a lower metal pattern 2252 formed in the uppermost metal layer of the peripheral circuit region PERI, and having the same cross-sectional shape as the lower metal pattern 2252 of the peripheral circuit region PERI, may be formed in an uppermost metal layer of the cell region CELL. According to embodiments, a contact is not formed on the upper metal pattern 2392 formed in the uppermost metal layer of the cell region CELL. The lower metal pattern 2252 may be included in lower bonding metals 2251 and 2252.

In an example embodiment, corresponding to a metal pattern formed in an uppermost metal layer in one of the cell region CELL and the peripheral circuit region PERI, a reinforcement metal pattern having the same cross-sectional shape as the metal pattern may be formed in an uppermost metal layer in the other one of the cell region CELL and the peripheral circuit region PERI. According to embodiments, a contact is not formed on the reinforcement metal pattern.

The word-line voltages may be applied to at least one memory block in the cell region CELL through the lower bonding metals 2271b and 2272b in the peripheral circuit region PERI and upper bonding metals 2371b and 2372b of the cell region CELL.

FIG. 28 is a block diagram illustrating an electronic system including a semiconductor device according to example embodiments.

Referring to FIG. 28, an electronic system 3000 may include a semiconductor device 3100 and a controller 3200 electrically connected to the semiconductor device 3100.

The electronic system 3000 may be a storage device including one or a plurality of semiconductor devices 3100 or an electronic device including a storage device. For example, the electronic system 3000 may be a solid state drive (SSD) device, a universal serial bus (USB) device, a computing system, a medical device, or a communication device that may include one or a plurality of semiconductor devices 3100.

The semiconductor device 3100 may be a non-volatile memory device, for example, a NAND flash memory device as illustrated with reference to FIGS. 2 to 22. The semiconductor device 3100 may include a first structure 3100F and a second structure 3100S disposed on the first structure 3100F. The first structure 3100F may be a peripheral circuit structure including a decoder circuit 3110, a page buffer circuit 3120, and a logic circuit 3130. The second structure 3100S may be a memory cell structure including a bit-line BL, a common source line CSL, word-lines WL, first and second upper gate lines UL1 and UL2, first and second lower gate lines LL1 and LL2, and memory cell strings CSTR disposed between the bit line BL and the common source line CSL.

In the second structure 3100S, each of the memory cell strings CSTR may include lower transistors LT1 and LT2 disposed adjacent to the common source line CSL, upper transistors UT1 and UT2 disposed adjacent to the bit-line BL, and a plurality of memory cell transistors MCT disposed between the lower transistors LT1 and LT2 and the upper transistors UT1 and UT2. The number of the lower transistors LT1 and LT2 and the number of the upper transistors UT1 and UT2 may be varied in accordance with example embodiments.

In example embodiments, the upper transistors UT1 and UT2 may include string selection transistors, and the lower transistors LT1 and LT2 may include ground selection transistors. The lower gate lines LL1 and LL2 may be gate electrodes of the lower transistors LT1 and LT2, respectively. The word lines WL may be gate electrodes of the memory cell transistors MCT, respectively, and the upper gate lines UL1 and UL2 may be gate electrodes of the upper transistors UT1 and UT2, respectively.

In example embodiments, the lower transistors LT1 and LT2 may include a lower erase control transistor LT1 and a ground selection transistor LT2 that may be connected with each other in serial. The upper transistors UT1 and UT2 may include a string selection transistor UT1 and an upper erase control transistor UT2. At least one of the lower erase control transistor LT1 and the upper erase control transistor UT2 may be used in an erase operation for erasing data stored in the memory cell transistors MCT through a gate induced drain leakage (GIDL) phenomenon.

The common source line CSL, the first and second lower gate lines LL1 and LL2, the word lines WL, and the first and second upper gate lines UL1 and UL2 may be electrically connected to the decoder circuit 3110 through first connection wirings 1115 extending to the second structure 3110S in the first structure 3100F. The bit-lines BL may be electrically connected to the page buffer circuit 3120 through second connection wirings 3125 extending to the second structure 3100S in the first structure 3100F.

In the first structure 3100F, the decoder circuit 3110 and the page buffer circuit 3120 may perform a control operation for at least one selected memory cell transistor among the plurality of memory cell transistors MCT. The decoder circuit 3110 and the page buffer circuit 3120 may be controlled by the logic circuit 3130. The semiconductor device 3100 may communicate with the controller 3200 through an input/output pad 3101 electrically connected to the logic circuit 3130. The input/output pad 3101 may be electrically connected to the logic circuit 3130 through an input/output connection wiring 3135 extending to the second structure 3100S in the first structure 3100F.

The controller 3200 may include a processor 3210, a NAND controller 3220, and a host interface 3230. The electronic system 3000 may include a plurality of semiconductor devices 3100, and in this case, the controller 3200 may control the plurality of semiconductor devices 3100.

The processor 3210 may control operations of the electronic system 3000 including the controller 3200. The processor 3210 may be operated by firmware, and may control the NAND controller 3220 to access the semiconductor device 3100. The NAND controller 3220 may include a NAND interface 3221 for communicating with the semiconductor device 3100. Through the NAND interface 3221, control command for controlling the semiconductor device 3100, data to be written in the memory cell transistors MCT of the semiconductor device 3100, data to be read from the memory cell transistors MCT of the semiconductor device 3100, etc., may be transferred. The host interface 3230 may provide communication between the electronic system 3000 and an outside host. When control command is received from outside of the host through the host interface 3230, the processor 3210 may control the semiconductor device 3100 in response to the control command.

As is traditional in the field of the present disclosure, example embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions.

According to example embodiments of the present disclosure, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array. In an example embodiment of the present disclosure, the 3D memory array includes vertical NAND strings that are vertically oriented such that at least one memory cell is located over another memory cell. The at least one memory cell may include a charge trap layer. The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

A nonvolatile memory device or a storage device according to example embodiments may be packaged using various package types or package configurations.

Embodiments of the present disclosure may be applied to various devices and systems that include the nonvolatile memory devices.

While the present disclosure has been particularly shown and described with reference to example embodiments thereof, it will be understood by those of ordinary skill in the art that various changes in form and detail may be made therein without departing from the spirit and scope of the present disclosure as defined by the following claims.

What is claimed is:

1. A nonvolatile memory device, comprising:
a first semiconductor layer comprising:
an upper substrate in which a plurality of word-lines extending in a first horizontal direction, at least one string selection line, at least one ground selection line, and a plurality of bit-lines extending in a second horizontal direction substantially perpendicular to the first horizontal direction are disposed; and
a memory cell array including at least one memory block disposed on the upper substrate; and
a second semiconductor layer disposed under the first semiconductor layer in a vertical direction substantially perpendicular to the first and second horizontal directions, wherein the second semiconductor layer includes a first address decoder and a second address decoder, wherein the at least one memory block includes a cell region including a plurality of memory cells, a first extension region disposed in a first side of the cell region, and a second extension region disposed in a second side of the cell region, the second side opposed to the first side, wherein the first address decoder is disposed under the first extension region and includes a plurality of first pass transistors configured to drive the plurality of word-lines, the at least one string selection line and the at least one ground selection line, and wherein the second address decoder is disposed under the second extension region and includes a plurality of second pass transistors configured to drive the at least one string selection line and the at least one ground selection line.

2. The nonvolatile memory device of claim 1,
wherein the first extension region includes a first step zone disposed adjacent to the first side, a second step zone, and a first flat zone disposed between the first step zone and the second step zone,
wherein each of the first step zone and the second step zone has a stepped shape that descends from the first side and a periphery of the first flat zone, respectively, and the first flat zone has a flat shape,
wherein the second extension region includes a third step zone disposed adjacent to the second side, and a second flat zone disposed adjacent to the third step zone, and
wherein the third step zone has a stepped shape that descends from the second side, and the second flat zone has a flat shape and includes an insulating mold structure.

3. The nonvolatile memory device of claim 2,
wherein a plurality of through-hall contacts are disposed in and penetrate the first step zone and the second step zone, and
wherein the plurality of first pass transistors are electrically connected to the plurality of word-lines, the at least one string selection line, and the at least one ground selection line through the plurality of through-hall contacts.

4. The nonvolatile memory device of claim 3, wherein each of the plurality of through-hall contacts has a merged type of a through-hall via and a word-line contact.

5. The nonvolatile memory device of claim 2,
wherein a plurality of through-hall vias penetrating the insulating mold structure are provided in the second flat zone and the second step zone, and
wherein the plurality of second pass transistors are electrically connected to the at least one string selection line and the at least one ground selection line through the plurality of through-hall vias.

6. The nonvolatile memory device of claim 1, wherein first address decoder is configured to:
apply a high voltage to each gate of the plurality of first pass transistors using upper wires and lower wires; and
apply the high voltage to each gate of the plurality of second pass transistors using the lower wires.

7. The nonvolatile memory device of claim 1, wherein the first address decoder comprises:
a block selection driver configured to apply a high voltage to a block word-line coupled to gates of the plurality of first pass transistors and gates of the plurality of second pass transistors;

a first string selection driver configured to drive the at least one string selection line;
a word-driver configured to drive the plurality of word-lines with word-line voltages; and
a first ground selection driver configured to drive the at least one ground selection line.

8. The nonvolatile memory device of claim 7, wherein the second address decoder comprises:
a second string selection driver configured to drive the at least one string selection line; and
a second ground selection driver configured to drive the at least one ground selection line.

9. The nonvolatile memory device of claim 8, wherein the first address decoder is supplied with a first voltage, and
the second address decoder is supplied with a second voltage lower than the first voltage.

10. The nonvolatile memory device of claim 9, wherein the first string selection driver and the second string selection driver are configured to drive the at least one string selection line based on a turn-on voltage and a turn-off voltage, and
the first ground selection driver and the second ground selection driver are configured to drive the at least one ground selection line based on the turn-on voltage and the turn-off voltage.

11. The nonvolatile memory device of claim 7, wherein the block selection driver comprises:
a pre-decoder configured to generate an enable signal based on decoded signals provided based on a row address; and
a high voltage switch circuit configured to apply a block selection signal to the block word-line in response to the enable signal,
wherein the block selection signal swings between the high voltage and a negative voltage.

12. The nonvolatile memory device of claim 1, wherein the plurality of first pass transistors comprise:
a first string pass transistor connected to the at least one string selection line through a first through-hall contact;
a plurality of word-line pass transistors connected to the plurality of word-lines, respectively, through a plurality of second through-hall contacts; and
a first ground pass transistor connected to the at least one ground selection line through a third through-hall contact.

13. The nonvolatile memory device of claim 12, wherein the plurality of second pass transistors comprise:
a second string pass transistor connected to the at least one string selection line through a first through-hall via and a string selection line contact; and
a second ground pass transistor connected to the at least one ground selection line through a second through-hall via and a ground selection line contact.

14. The nonvolatile memory device of claim 13, wherein a size of each of the first through-hall contact, the plurality of second through-hall contacts, and the third through-hall contact is greater than a size of the string selection line contact and a size of the ground selection line contact.

15. The nonvolatile memory device of claim 12, wherein the first through-hall contact is connected to the at least one string selection line by penetrating insulating regions of a first step zone of the plurality of word-lines and the at least one ground selection line, the first step zone having a stepped shape.

16. The nonvolatile memory device of claim 1, wherein the second semiconductor layer further comprises:

a voltage generator configured to generate a high voltage, word-line voltages, a turn-on voltage, and a turn-off voltage based on control signals;

a page buffer circuit coupled to the memory cell array through the plurality of bit-lines, the page buffer circuit configured to latch sensed data in a sensing operation; and a control circuit configured to control the first address decoder, the second address decoder, the voltage generator, and the page buffer circuit based on a command and an address, wherein the control circuit is configured to control the first address decoder, the second address decoder and the voltage generator to:

apply the high voltage to each gate of the plurality of first pass transistors and the plurality of second pass transistors, apply the word-line voltages, the turn-on voltage, and the turn-off voltage to the plurality of first pass transistors, and apply the turn-on voltage and the turn-off voltage to the plurality of second pass transistors.

17. The nonvolatile memory device of claim 1, wherein:

in the first extension region, the plurality of word-lines and a plurality of insulating interlayers are alternately stacked in the vertical direction; and in the second extension region, the insulating mold structure is formed by an insulating material filled in the vertical direction.

18. A nonvolatile memory device, comprising:

a first semiconductor layer comprising:

an upper substrate in which a plurality of word-lines extending in a first horizontal direction, at least two string selection lines, at least one ground selection line, and a plurality of bit-lines extending in a second horizontal direction substantially perpendicular to the first horizontal direction are disposed; and a memory cell array including at least one memory block disposed on the upper substrate; and a second semiconductor layer disposed under the first semiconductor layer in a vertical direction substantially perpendicular to the first and second horizontal directions, wherein the second semiconductor layer includes a first address decoder and a second address decoder, wherein the at least one memory block includes a cell region including a plurality of memory cells, a first extension region disposed in a first side of the cell region, and a second extension region disposed in a second side of the cell region, the second side opposed to the first side, wherein the first address decoder is disposed under the first extension region and includes a plurality of first pass transistors configured to drive the plurality of word-lines, the at least two string selection lines and the at least one ground selection line, wherein the second address decoder is disposed under the second extension region and includes a plurality of second pass transistors configured to drive the at least two string selection lines, wherein the first extension region includes a plurality of step zones and the second extension region includes an insulating mold structure, wherein a plurality of through-hall contacts are disposed in and penetrate the plurality of step zones, and the plurality of first pass transistors are electrically connected to the plurality of word-lines, the at least two string selection lines, and the at least one ground selection line, and wherein a plurality of through-hall vias are disposed in and penetrate the insulating mold structure, and the plurality of second pass transistors are electrically connected to the at least two string selection lines.

19. A method of operating a nonvolatile memory device, the method comprising:

driving a plurality of word-lines, at least one string selection line, and at least one ground selection line disposed in a first semiconductor layer by a first address decoder, wherein the first address decoder is disposed in a second semiconductor layer and disposed under a first extension region of a first side of a cell region including a plurality of memory cells in the first semiconductor layer; and driving the at least one string selection line and the at least one ground selection line by a second address decoder, wherein the second address decoder is disposed in the second semiconductor layer and disposed under a second extension region of a second side of the cell region opposed to the first side.

20. The method of claim 19, wherein driving the plurality of word-lines, the at least one string selection line, and the at least one ground selection line by the first address decoder comprises:

electrically connecting first pass transistors in the first address decoder to the plurality of word-lines, the at least one string selection line, and the at least one ground selection line through through-hall contacts penetrating a stair region in the first extension region, and wherein driving the at least one string selection line and the at least one ground selection line by the second address decoder comprises:

electrically connecting second pass transistors in the second address decoder to the at least one string selection line and the at least one ground selection line through through-hall vias penetrating an insulating mold structure in the second extension region and selection line contacts.

* * * * *